(12) United States Patent
Yaoi et al.

(10) Patent No.: US 7,626,313 B2
(45) Date of Patent: Dec. 1, 2009

(54) SURFACE ACOUSTIC WAVE DEVICE

(75) Inventors: Mari Yaoi, Yasu (JP); Tetsuya Kimura, Ohmihachiman (JP); Michio Kadota, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/341,259

(22) Filed: Dec. 22, 2008

(65) Prior Publication Data

US 2009/0096320 A1    Apr. 16, 2009

Related U.S. Application Data

(63) Continuation of application No. PCT/JP2007/061756, filed on Jun. 11, 2007.

(30) Foreign Application Priority Data

Jul. 5, 2006   (JP) .............................. 2006-185246
Dec. 19, 2006  (JP) .............................. 2006-341231

(51) Int. Cl.
   *H01L 41/08*    (2006.01)
   *H03H 9/145*    (2006.01)

(52) U.S. Cl. .............................. 310/313 B; 310/313 R; 333/195

(58) Field of Classification Search ............... 310/313; 333/189–195
   See application file for complete search history.

(56) References Cited

U.S. PATENT DOCUMENTS

| 4,879,487 | A * | 11/1989 | Sugai et al. ............. 310/313 A |
| 6,677,696 | B1 | 1/2004 | Ruile |
| 7,230,365 | B2 | 6/2007 | Nishiyama et al. |
| 7,411,334 | B2 | 8/2008 | Nishiyama et al. |
| 7,418,772 | B2 | 9/2008 | Nishiyama et al. |
| 7,425,788 | B2 * | 9/2008 | Kadota et al. ............ 310/313 B |
| 2005/0127794 | A1 * | 6/2005 | Ozaki et al. .............. 310/346 |
| 2007/0120439 | A1 | 5/2007 | Kadota et al. |
| 2008/0296999 | A1 * | 12/2008 | Kido et al. ............. 310/313 B |

FOREIGN PATENT DOCUMENTS

| JP | 56-064509 A | 6/1981 |
| JP | 09-083030 A | 3/1997 |
| JP | 10-178331 A | 6/1998 |
| JP | 10270974 A * | 10/1998 |
| JP | 10-335966 A | 12/1998 |
| JP | 2002-026685 A | 1/2002 |
| JP | 2008294538 A * | 12/2008 |
| WO | 2006/011417 A1 | 2/2006 |
| WO | WO 2007080734 A1 * | 7/2007 |

OTHER PUBLICATIONS

Official Communication issued in International Patent Application No. PCT/JP2007/061756, mailed on Sep. 18, 2007.

* cited by examiner

*Primary Examiner*—Jaydi SanMartin
(74) *Attorney, Agent, or Firm*—Keating & Bennett, LLP

(57) ABSTRACT

A surface acoustic wave device includes a $LiNbO_3$ substrate having a plurality of grooves formed in the upper surface thereof, an IDT electrode formed by filling the grooves with a metal, and a $SiO_2$ layer arranged to cover an upper surface of the $LiNbO_3$ substrate and the IDT electrode and having a substantially flat surface. The surface acoustic wave device uses a response of a Rayleigh wave. The $LiNbO_3$ substrate has Euler angles in the range of (0°±5°, 180° to 247°, 0°±5°).

12 Claims, 21 Drawing Sheets

SH WAVES $SiO_2/Al/LN$  $Al = 4\%$

RAYLEIGH WAVES $SiO_2/Al/LN$  $Al = 8\%$

SH WAVES $SiO_2$ / Au /LN  Au = 3 %

RAYLEIGH WAVES $SiO_2$ / Au /LN  Au = 3.5 %

SH WAVES SiO$_2$ / Au / LN   Au = 3.5 %

RAYLEIGH WAVES SiO$_2$ / Au / LN   Au = 4 %

SH WAVES $SiO_2$ / Au / LN   Au = 4 %

RAYLEIGH WAVES $SiO_2$ / Cu / LN   Cu = 2 %

SH WAVES $SiO_2$ / Cu / LN  Cu = 4 %

RAYLEIGH WAVES $SiO_2$ / Cu / LN  Cu = 6 %

SH WAVES SiO₂ / Cu / LN Cu = 6 %

RAYLEIGH WAVES SiO₂ / Cu / LN Cu = 8 %

SURFACE ACOUSTIC WAVE DEVICE

BACKGROUND OF THE INVENTION

1. Field of the Invention

The present invention relates to a surface acoustic wave device including a piezoelectric substrate, an IDT electrode, and a $SiO_2$ film covering the piezoelectric substrate and the IDT electrode. In particular, the present invention relates to a surface acoustic wave device including an IDT electrode formed by filling grooves provided in the upper surface of a piezoelectric substrate with a metal.

2. Description of the Related Art

Duplexers (DPX) and RF filters, which are used for mobile communication systems such as mobile phones, are required to have broadband characteristics and good temperature characteristics. Surface acoustic wave devices have been commonly used as DPXs and RF filters.

Surface acoustic wave devices used in such applications typically include a piezoelectric substrate made of $LiTaO_3$, $LiNbO_3$, or other suitable material and an IDT electrode thereon. $LiTaO_3$ and $LiNbO_3$ have negative values of a temperature coefficient of resonant frequency (TCF). To improve such temperature characteristics, one technique is known in which a $SiO_2$ film having a positive temperature coefficient of resonant frequency is arranged on a piezoelectric substrate to cover an IDT electrode.

However, this technique produces a height difference of the $SiO_2$ film between a portion in which fingers of an IDT electrode are provided and a portion in which the fingers of the IDT electrode are not provided. The height difference causes insertion loss to increase.

To solve this problem, Japanese Unexamined Patent Application Publication No. 2004-112748 discloses a method including forming a first insulator layer, which has substantially the same film thickness as an IDT electrode, between the IDT electrode fingers, and forming a $SiO_2$ film to cover the IDT electrode and the first insulator layer. In this method, since the $SiO_2$ film is formed on a substantially flat base, the $SiO_2$ film has a substantially flat surface. The IDT electrode of the surface acoustic wave device in Japanese Unexamined Patent Application Publication No. 2004-112748 is made of a metal having a higher density than Al or an alloy primarily including the metal, or a multilayer film including a metal having a higher density than Al or an alloy primarily including the metal and another metal. The IDT electrode has a density at least about 1.5 times that of the first insulator layer.

Since the electrode of the surface acoustic wave device in Japanese Unexamined Patent Application Publication No. 2004-112748 primarily includes a metal that is heavier than Al, large variations tend to occur in the velocity and the frequency of acoustic waves which depend on variations in the thickness of the electrode. In contrast, an electrode made of Al has a very low reflection coefficient and cannot exhibit characteristics sufficiently good for surface acoustic wave resonators and surface acoustic wave filters.

To overcome such a problem, WO2006/011417A1 discloses a configuration including a piezoelectric substrate made of $LiTaO_3$ or $LiNbO_3$ having a plurality of grooves provided in the upper surface and an IDT electrode formed by filling the grooves with a metal, such as Al. A surface acoustic wave device of WO2006/011417A1 includes an IDT electrode formed by filling grooves with metal and a $SiO_2$ film covering the IDT electrode. WO2006/011417A12 discloses that the $SiO_2$ film is formed on a substantially flat base, and thus, the $SiO_2$ film has a substantially flat surface.

WO2006/011417A1 also discloses that $LiTaO_3$ substrates with Euler angles and $LiNbO_3$ substrates with Euler angles (0°, 85° to 120°, 0°), (0°, 125° to 141°, 0°), (0°, 145° to 164°, 0°), or (0°, 160° to 180°, 0°) are preferably used; and $LiNbO_3$ substrates with Euler angles (0°, 90° to 110°, 0°), (0°, 125° to 136°, 0°), (0° 149° to 159°, 0°), or (0°, 165° to 175°, 0°) are more preferably used.

A configuration intended to have improved temperature characteristics of resonant frequency that is formed by disposing a $SiO_2$ film on an IDT electrode made of Al provides a low reflection coefficient as described above and tends to have insufficient characteristics. In contrast, since the configuration in WO2006/011417A1 includes an IDT electrode formed by filling grooves provided in a piezoelectric substrate with Al, the electrode has a sufficiently high reflection coefficient. The configuration also includes a $SiO_2$ film and thus has improved temperature characteristics of resonant frequency. The $SiO_2$ film has a substantially flat surface, and thus, the insertion loss does not significantly increase.

However, an inventor of the present invention has discovered that, when a response of a Rayleigh wave is utilized in the surface acoustic wave device including a $LiNbO_3$ substrate in WO2006/011417A1, a large spurious response occurs near an attenuation pole of a main response being used. Thus, the spurious response may potentially degrade the filter characteristics and the resonance characteristics.

SUMMARY OF THE INVENTION

To overcome the problems described above, preferred embodiments of the present invention provide a surface acoustic wave device that has improved temperature characteristics of resonant frequency by including a $SiO_2$ film, that causes little or no increase in insertion loss to increase, that has an electrode with a sufficiently high reflection coefficient, and that suppresses unwanted spurious responses, thereby having improved resonance characteristics and filter characteristics.

A surface acoustic wave device according to a preferred embodiment of the present invention includes a piezoelectric substrate having a plurality of grooves provided in a upper surface of the substrate, an IDT electrode defined by metal filled in the grooves, and a $SiO_2$ layer arranged to cover the piezoelectric substrate and the IDT electrode and having a substantially flat upper surface, wherein the device uses a response of a Rayleigh wave excited in the piezoelectric substrate, and the piezoelectric substrate is a $LiNbO_3$ substrate having Euler angles (0°±5°, 180° to 247°, 0°±5°).

The metal is not particularly restricted. However, a preferred metal primarily includes one metal selected from the group consisting of Al, Au, Ta, and Cu. Al, Au, Ta, and Cu, for example, are commonly used to form IDT electrodes of surface acoustic wave devices. An electrode formed by filling grooves provided in a piezoelectric substrate with any one of the metals has a sufficiently high reflection coefficient.

The metal primarily including one metal selected from the group consisting of Al, Au, Ta, and Cu may preferably be one metal selected from the group consisting of Al, Au, Ta, and Cu, or an alloy primarily including the one metal. Alternatively, the metal primarily including one metal selected from the group consisting of Al, Au, Ta, and Cu may preferably be a multilayer metal film. Such a multilayer metal film, for example, includes one metal selected from the group consisting of Al, Au, Ta, and Cu or an alloy primarily including the one metal, and an alloy primarily including one metal selected from the group consisting of Ti, Ni, Cr, NiCr, Al, and AlCu disposed thereon.

In a surface acoustic wave device according to preferred embodiments of the present invention, the metal preferably primarily includes Al, and a normalized film thickness (%) of the IDT electrode normalized with a wavelength λ of a surface acoustic wave, a normalized film thickness (%) of the $SiO_2$ film normalized with the wavelength λ of the surface acoustic wave, and θ (°) of Euler angles (φ, θ, ψ) of $LiNbO_3$ are within ranges shown in Table 1 below:

TABLE 1

| IDT electrode (mainly containing Al) | Thickness of $SiO_2$ film | θ (°) achieving $K_R^2 > 0.08$ and $K_{SH}^2 < 0.02$ |
|---|---|---|
| 2% < h/λ ≦ 6% | 17.5% < h/λ ≦ 22.5% | 210~228 |
| | 22.5% < h/λ ≦ 27.5% | 201~235 |
| | 27.5% < h/λ ≦ 32.5% | 207~229 |
| | 32.5% < h/λ ≦ 37.5% | 210~225 |
| 6% < h/λ ≦ 10% | 17.5% < h/λ ≦ 22.5% | 205~231 |
| | 22.5% < h/λ ≦ 27.5% | 204~232 |
| | 27.5% < h/λ ≦ 32.5% | 202~231 |
| | 32.5% < h/λ ≦ 37.5% | 202~232 |
| 10% < h/λ ≦ 14% | 17.5% < h/λ ≦ 22.5% | 197~239 |
| | 22.5% < h/λ ≦ 27.5% | 198~238 |
| | 27.5% < h/λ ≦ 32.5% | 194~236 |
| | 32.5% < h/λ ≦ 37.5% | 197~233 |
| 14% < h/λ ≦ 18% | 17.5% < h/λ ≦ 22.5% | 187~243 |
| | 22.5% < h/λ ≦ 27.5% | 181~242 |
| | 27.5% < h/λ ≦ 32.5% | 181~247 |
| | 32.5% < h/λ ≦ 37.5% | 188~236 |
| 18% < h/λ ≦ 22% | 17.5% < h/λ ≦ 22.5% | 180~242 |
| | 22.5% < h/λ ≦ 27.5% | 182~246 |
| | 27.5% < h/λ ≦ 32.5% | 184~238 |
| | 32.5% < h/λ ≦ 37.5% | 208~212 |
| 22% < h/λ ≦ 26% | 17.5% < h/λ ≦ 22.5% | 180~243 |
| | 22.5% < h/λ ≦ 27.5% | 181~240 |
| | 27.5% < h/λ ≦ 32.5% | 191~227 |
| | 32.5% < h/λ ≦ 37.5% | No range achieving $K_R^2 > 0.08$ |

When the metal primarily includes Al, and the normalized film thickness of the IDT electrode, the normalized film thickness of the $SiO_2$ film, and the Euler angle of $LiNbO_3$ are within ranges shown in Table 1, unwanted spurious responses can be effectively suppressed.

More preferably, the normalized film thickness (%) of the IDT electrode, the normalized film thickness (%) of the $SiO_2$ film, and θ (°) of Euler angles (φ, θ, ψ) of $LiNbO_3$ are within ranges shown in Table 2 below:

TABLE 2

| IDT electrode (mainly containing Al) | Thickness of $SiO_2$ film | θ (°) achieving $K_R^2 > 0.08$ and $K_{SH}^2 < 0.01$ |
|---|---|---|
| 2% < h/λ ≦ 6% | 17.5% < h/λ ≦ 22.5% | 210~228 |
| | 22.5% < h/λ ≦ 27.5% | 201~231 |
| | 27.5% < h/λ ≦ 32.5% | 208~225 |
| | 32.5% < h/λ ≦ 37.5% | 210~225 |
| 6% < h/λ ≦ 10% | 17.5% < h/λ ≦ 22.5% | 205~231 |
| | 22.5% < h/λ ≦ 27.5% | 204~232 |
| | 27.5% < h/λ ≦ 32.5% | 206~226 |
| | 32.5% < h/λ ≦ 37.5% | 202~228 |
| 10% < h/λ ≦ 14% | 17.5% < h/λ ≦ 22.5% | 197~238 |
| | 22.5% < h/λ ≦ 27.5% | 198~238 |
| | 27.5% < h/λ ≦ 32.5% | 200~230 |
| | 32.5% < h/λ ≦ 37.5% | 197~233 |
| 14% < h/λ ≦ 18% | 17.5% < h/λ ≦ 22.5% | 187~243 |
| | 22.5% < h/λ ≦ 27.5% | 181~242 |
| | 27.5% < h/λ ≦ 32.5% | 181~247 |
| | 32.5% < h/λ ≦ 37.5% | 188~236 |
| 18% < h/λ ≦ 22% | 17.5% < h/λ ≦ 22.5% | 180~242 |
| | 22.5% < h/λ ≦ 27.5% | 182~246 |
| | 27.5% < h/λ ≦ 32.5% | 184~238 |
| | 32.5% < h/λ ≦ 37.5% | 208~212 |
| 22% < h/λ ≦ 26% | 17.5% < h/λ ≦ 22.5% | 180~243 |
| | 22.5% < h/λ ≦ 27.5% | 181~240 |
| | 27.5% < h/λ ≦ 32.5% | 191~227 |
| | 32.5% < h/λ ≦ 37.5% | No range achieving $K_R^2 > 0.08$ |

When the normalized film thickness of the IDT electrode, the normalized film thickness of the $SiO_2$ film, and the Euler angle are within ranges shown in Table 2, unwanted spurious responses can be further suppressed.

In a surface acoustic wave device according to another preferred embodiment of the present invention, the metal preferably primarily includes Au, and a normalized film thickness (%) of the IDT electrode normalized with a wavelength λ of a surface acoustic wave, a normalized film thickness (%) of the $SiO_2$ film normalized with the wavelength λ of the surface acoustic wave, and θ (°) of Euler angles (φ, θ, ψ) of $LiNbO_3$ are within ranges shown in Table 3 below:

TABLE 3

| Film thickness of IDT electrode (mainly containing Au) | Thickness of $SiO_2$ film | θ (°) out of Euler angles (φ, θ, ψ) achieving $K_R^2 > 0.08$ and $K_{SH}^2 < 0.02$ |
|---|---|---|
| 1.5% < h/λ ≦ 2.5% | 17.5% < h/λ ≦ 22.5% | 208~224 |
| | 22.5% < h/λ ≦ 27.5% | 208~222 |
| | 27.5% < h/λ ≦ 32.5% | 208~224 |
| | 32.5% < h/λ ≦ 37.5% | 210~225 |
| | 37.5% < h/λ ≦ 42.5% | No range achieving $K_R^2 > 0.08$ |
| 2.5% < h/λ ≦ 3.25% | 17.5% < h/λ ≦ 22.5% | 209~221 |
| | 22.5% < h/λ ≦ 27.5% | 209~221 |
| | 27.5% < h/λ ≦ 32.5% | 209~223 |
| | 32.5% < h/λ ≦ 37.5% | 210~225 |
| | 37.5% < h/λ ≦ 42.5% | 212~224 |
| 3.25% < h/λ ≦ 3.75% | 17.5% < h/λ ≦ 22.5% | No range achieving $K_{SH}^2 < 0.020$ |
| | 22.5% < h/λ ≦ 27.5% | No range achieving $K_{SH}^2 < 0.020$ |
| | 27.5% < h/λ ≦ 32.5% | No range achieving $K_{SH}^2 < 0.020$ |
| | 32.5% < h/λ ≦ 37.5% | 210~225 |
| | 37.5% < h/λ ≦ 42.5% | 212~224 |

When the metal primarily includes Au, and the normalized film thickness of the IDT electrode, the normalized film thickness of the $SiO_2$ film, and the Euler angle of $LiNbO_3$ are within ranges shown in Table 1, unwanted spurious responses can be effectively suppressed.

More preferably, the normalized film thickness (%) of the IDT electrode, the normalized film thickness (%) of the $SiO_2$ film, and θ (°) of Euler angles (φ, θ, ψ) of $LiNbO_3$ are within ranges shown in Table 4 below:

TABLE 4

| Film thickness of IDT electrode (mainly containing Au) | Thickness of $SiO_2$ film | θ (°) out of Euler angles (φ, θ, ψ) achieving $K_R^2 > 0.08$ and $K_{SH}^2 < 0.01$ |
|---|---|---|
| 1.5% < h/λ ≦ 2.5% | 17.5% < h/λ ≦ 22.5% | 210~224 |
| | 22.5% < h/λ ≦ 27.5% | 211~222 |
| | 27.5% < h/λ ≦ 32.5% | 210~224 |

TABLE 4-continued

| Film thickness of IDT electrode (mainly containing Au) | Thickness of SiO₂ film | θ (°) out of Euler angles (φ, θ, ψ) achieving $K_R^2 > 0.08$ and $K_{SH}^2 < 0.01$ |
|---|---|---|
| | 32.5% < h/λ ≦ 37.5% | 210~225 |
| | 37.5% < h/λ ≦ 42.5% | No range achieving $K_R^2 > 0.08$ |
| 2.5% < h/λ ≦ 3.25% | 17.5% < h/λ ≦ 22.5% | 214~221 |
| | 22.5% < h/λ ≦ 27.5% | No range achieving $K_{SH}^2 < 0.01$ |
| | 27.5% < h/λ ≦ 32.5% | 214~218 |
| | 32.5% < h/λ ≦ 37.5% | 210~225 |
| | 37.5% < h/λ ≦ 42.5% | 212~223 |
| 3.25% < h/λ ≦ 3.75% | 17.5% < h/λ ≦ 22.5% | No range achieving $K_{SH}^2 < 0.01$ |
| | 22.5% < h/λ ≦ 27.5% | No range achieving $K_{SH}^2 < 0.01$ |
| | 27.5% < h/λ ≦ 32.5% | No range achieving $K_{SH}^2 < 0.01$ |
| | 32.5% < h/λ ≦ 37.5% | No range achieving $K_{SH}^2 < 0.01$ |
| | 37.5% < h/λ ≦ 42.5% | 212~222 |

When the normalized film thickness of the IDT electrode, the normalized film thickness of the SiO₂ film, and the Euler angle are within ranges shown in Table 4, unwanted spurious responses can be further suppressed.

In a surface acoustic wave device according to another preferred embodiment of the present invention, the metal preferably primarily includes Cu, and a normalized film thickness (%) of the IDT electrode normalized with a wavelength λ of a surface acoustic wave, a normalized film thickness (%) of the SiO₂ film normalized with the wavelength λ of the surface acoustic wave, and θ (°) of Euler angles (φ, θ, ψ) of LiNbO₃ are within ranges shown in Table 5 below:

TABLE 5

| Film thickness of IDT electrode (mainly containing Cu) | Thickness of SiO₂ film | θ (°) out of Euler angles (φ, θ, ψ) achieving $K_R^2 > 0.08$ and $K_{SH}^2 < 0.02$ |
|---|---|---|
| 1% < h/λ ≦ 3% | 17.5% < h/λ ≦ 22.5% | 209~225 |
| | 22.5% < h/λ ≦ 27.5% | 209~225 |
| | 27.5% < h/λ ≦ 32.5% | 209~226 |
| | 32.5% < h/λ ≦ 37.5% | 214~222 |
| | 37.5% < h/λ ≦ 42.5% | No range achieving $K_R^2 > 0.08$ |
| 3% < h/λ ≦ 5% | 17.5% < h/λ ≦ 22.5% | 207~224 |
| | 22.5% < h/λ ≦ 27.5% | 207~225 |
| | 27.5% < h/λ ≦ 32.5% | 206~226 |
| | 32.5% < h/λ ≦ 37.5% | 207~227 |
| | 37.5% < h/λ ≦ 42.5% | No range achieving $K_R^2 > 0.08$ |
| 5% < h/λ ≦ 7% | 17.5% < h/λ ≦ 22.5% | 207~224 |
| | 22.5% < h/λ ≦ 27.5% | 208~225 |
| | 27.5% < h/λ ≦ 32.5% | 206~226 |
| | 32.5% < h/λ ≦ 37.5% | 204~227 |
| | 37.5% < h/λ ≦ 42.5% | 204~228 |
| 7% < h/λ ≦ 9% | 17.5% < h/λ ≦ 22.5% | 208~224 |
| | 22.5% < h/λ ≦ 27.5% | 208~224 |
| | 27.5% < h/λ ≦ 32.5% | 207~225 |
| | 32.5% < h/λ ≦ 37.5% | 205~226 |
| | 37.5% < h/λ ≦ 42.5% | 204~228 |

When the metal primarily includes Cu, and the normalized film thickness of the IDT electrode, the normalized film thickness of the SiO₂ film, and the Euler angle of LiNbO₃ are within ranges shown in Table 5, unwanted spurious responses can be effectively suppressed.

More preferably, the normalized film thickness (%) of the IDT electrode, the normalized film thickness (%) of the SiO₂ film, and θ (°) of Euler angles (φ, θ, ψ) of LiNbO₃ are within ranges shown in Table 6 below:

TABLE 6

| Film thickness of IDT electrode (mainly containing Cu) | Thickness of SiO₂ film | θ (°) out of Euler angles (φ, θ, ψ) achieving $K_R^2 > 0.08$ and $K_{SH}^2 < 0.01$ |
|---|---|---|
| 1% < h/λ ≦ 3% | 17.5% < h/λ ≦ 22.5% | 210~222 |
| | 22.5% < h/λ ≦ 27.5% | 210~222 |
| | 27.5% < h/λ ≦ 32.5% | 209~222 |
| | 32.5% < h/λ ≦ 37.5% | 214~222 |
| | 37.5% < h/λ ≦ 42.5% | No range achieving $K_R^2 > 0.08$ |
| 3% < h/λ ≦ 5% | 17.5% < h/λ ≦ 22.5% | 210~222 |
| | 22.5% < h/λ ≦ 27.5% | 210~222 |
| | 27.5% < h/λ ≦ 32.5% | 207~226 |
| | 32.5% < h/λ ≦ 37.5% | 207~224 |
| | 37.5% < h/λ ≦ 42.5% | No range achieving $K_R^2 > 0.08$ |
| 5% < h/λ ≦ 7% | 17.5% < h/λ ≦ 22.5% | 210~222 |
| | 22.5% < h/λ ≦ 27.5% | 210~222 |
| | 27.5% < h/λ ≦ 32.5% | 207~222 |
| | 32.5% < h/λ ≦ 37.5% | 208~224 |
| | 37.5% < h/λ ≦ 42.5% | 204~225 |
| 7% < h/λ ≦ 9% | 17.5% < h/λ ≦ 22.5% | 210~221 |
| | 22.5% < h/λ ≦ 27.5% | 210~221 |
| | 27.5% < h/λ ≦ 32.5% | 210~222 |
| | 32.5% < h/λ ≦ 37.5% | 208~223 |
| | 37.5% < h/λ ≦ 42.5% | 206~224 |

When the normalized film thickness of the IDT electrode, the normalized film thickness of the SiO₂ film, and the Euler angle are within ranges shown in Table 6, unwanted spurious responses can be further suppressed.

In a surface acoustic wave device according to another preferred embodiment of the present invention, the metal preferably primarily includes Ta, and a normalized film thickness (%) of the IDT electrode normalized with a wavelength λ of a surface acoustic wave, a normalized film thickness (%) of the SiO₂ film normalized with the wavelength λ of the surface acoustic wave, and θ (°) of Euler angles (φ, θ, ψ) of LiNbO₃ are within ranges shown in Table 7 below:

TABLE 7

| Film thickness of IDT electrode (mainly containing Ta) | Thickness of SiO₂ film | θ (°) out of Euler angles (φ, θ, ψ) achieving $K_R^2 > 0.08$ and $K_{SH}^2 < 0.02$ |
|---|---|---|
| 1.5% < h/λ ≦ 2.5% | 17.5% < h/λ ≦ 22.5% | 208~224 |
| | 22.5% < h/λ ≦ 27.5% | 208~225 |
| | 27.5% < h/λ ≦ 32.5% | 208~226 |
| | 32.5% < h/λ ≦ 37.5% | 210~224 |
| 2.5% < h/λ ≦ 3.5% | 17.5% < h/λ ≦ 22.5% | 206~224 |
| | 22.5% < h/λ ≦ 27.5% | 206~224 |
| | 27.5% < h/λ ≦ 32.5% | 207~225 |
| | 32.5% < h/λ ≦ 37.5% | 208~226 |
| 3.5% < h/λ ≦ 4.5% | 17.5% < h/λ ≦ 22.5% | 207~224 |
| | 22.5% < h/λ ≦ 27.5% | 207~224 |
| | 27.5% < h/λ ≦ 32.5% | 209~224 |
| | 32.5% < h/λ ≦ 37.5% | 207~226 |
| 4.5% < h/λ ≦ 5.5% | 17.5% < h/λ ≦ 22.5% | 207~223 |
| | 22.5% < h/λ ≦ 27.5% | 207~223 |
| | 27.5% < h/λ ≦ 32.5% | 207~224 |
| | 32.5% < h/λ ≦ 37.5% | 207~225 |

When the metal primarily includes Ta, and the normalized film thickness of the IDT electrode, the normalized film thickness of the SiO$_2$ film, and the Euler angle of LiNbO$_3$ are within ranges shown in Table 1, unwanted spurious responses can be effectively suppressed.

More preferably, the normalized film thickness (%) of the IDT electrode, the normalized film thickness (%) of the SiO$_2$ film, and θ (°) of Euler angles (φ, θ, ψ) of LiNbO$_3$ are within ranges shown in Table 8 below:

TABLE 8

| Film thickness of IDT electrode (mainly containing Ta) | Thickness of SiO$_2$ film | θ (°) out of Euler angles (φ, θ, ψ) achieving $K_R^2$ > 0.08 and $K_{SH}^2$ < 0.01 |
|---|---|---|
| 1.5% < h/λ ≦ 2.5% | 17.5% < h/λ ≦ 22.5% | 209~222 |
|  | 22.5% < h/λ ≦ 27.5% | 209~222 |
|  | 27.5% < h/λ ≦ 32.5% | 208~222 |
|  | 32.5% < h/λ ≦ 37.5% | 210~224 |
| 2.5% < h/λ ≦ 3.5% | 17.5% < h/λ ≦ 22.5% | 210~221 |
|  | 22.5% < h/λ ≦ 27.5% | 210~221 |
|  | 27.5% < h/λ ≦ 32.5% | 209~222 |
|  | 32.5% < h/λ ≦ 37.5% | 208~223 |
| 3.5% < h/λ ≦ 4.5% | 17.5% < h/λ ≦ 22.5% | 210~221 |
|  | 22.5% < h/λ ≦ 27.5% | 210~221 |
|  | 27.5% < h/λ ≦ 32.5% | 210~222 |
|  | 32.5% < h/λ ≦ 37.5% | 208~222 |
| 4.5% < h/λ ≦ 5.5% | 17.5% < h/λ ≦ 22.5% | 210~221 |
|  | 22.5% < h/λ ≦ 27.5% | 211~221 |
|  | 27.5% < h/λ ≦ 32.5% | 211~221 |
|  | 32.5% < h/λ ≦ 37.5% | 210~222 |

When the normalized film thickness of the IDT electrode, the normalized film thickness of the SiO$_2$ film, and the Euler angle are within ranges shown in Table 8, unwanted spurious responses can be further suppressed.

A surface acoustic wave device according to another preferred embodiment of the present invention includes a piezoelectric substrate having a plurality of grooves provided in the upper surface of the substrate, an IDT electrode defined by grooves that are filled with a metal, and a SiO$_2$ layer arranged to cover the piezoelectric substrate and the IDT electrode and having a substantially flat upper surface. The SiO$_2$ layer improves the temperature coefficient of resonant frequency of the device. Since the SiO$_2$ layer has a substantially flat upper surface, the SiO$_2$ film does not significantly cause an increase in insertion loss.

Since the IDT electrode is formed by filling the grooves, the SiO$_2$ layer does not significantly influence the reflection coefficient of the IDT electrode. Thus, the IDT electrode has a sufficiently high reflection coefficient. As will become clear from experimental examples described later, since the surface acoustic wave device uses a response of a Rayleigh wave and includes a LiNbO$_3$ substrate with the specific Euler angles as an piezoelectric substrate, ripples occurring near an attenuation pole of a main response are effectively suppressed and good frequency characteristics can be obtained.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Hereinafter, preferred embodiments of the present invention will be described with reference to the drawings.

Figure 1:
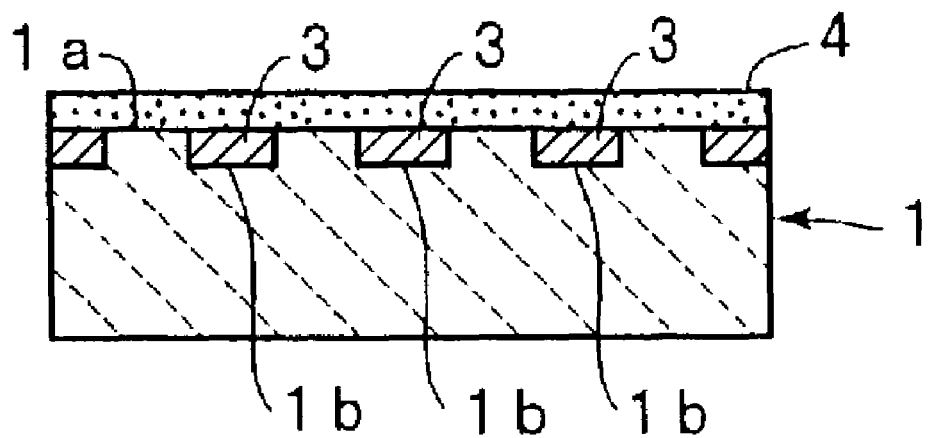
FIG. 1 is a schematic front section view of a surface acoustic wave device according to a preferred embodiment of the present invention.
Figure 2:
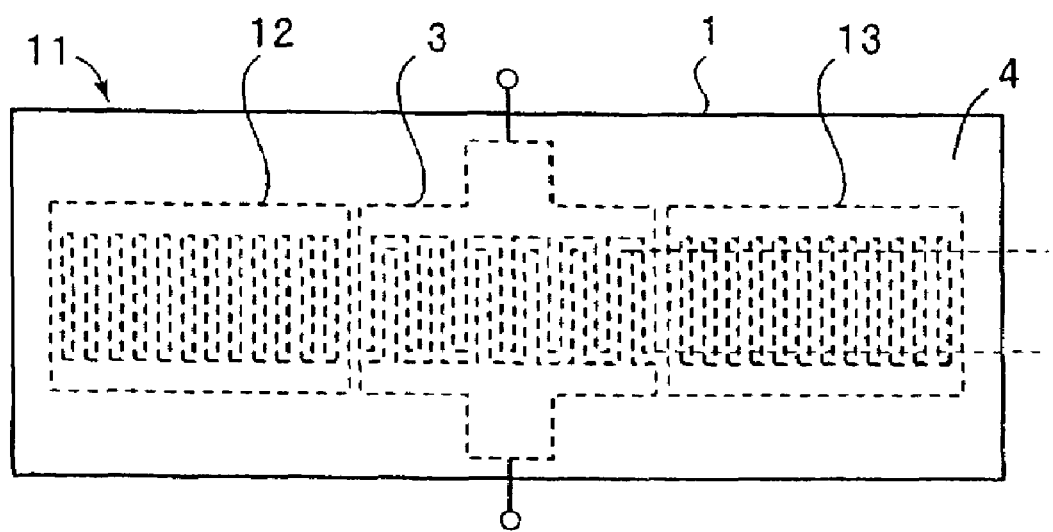
FIG. 2 is a schematic plan view of a surface acoustic wave device according to a preferred embodiment of the present invention.

FIG. 1 is a schematic front section view of a surface acoustic wave device according to a preferred embodiment of the present invention, to illustrate the configuration of the electrode. FIG. 2 is a schematic plan view of a surface acoustic wave device according to a preferred embodiment of the present invention.

Referring to FIG. 2, a surface acoustic wave device 11 includes a LiNbO$_3$ substrate 1. A plurality of grooves 1b shown in FIG. 1 are formed in the upper surface of the LiNbO$_3$ substrate 1. An IDT electrode 3 is formed by filling the grooves 1b with a metal.

That is, the IDT electrode 3 is formed by filling the grooves 1b with a metal such that the upper surface of the IDT electrode 3 is substantially flush with the upper surface of the LiNbO$_3$ substrate 1.

Referring to FIG. 2, reflectors 12 and 13 are arranged at both sides of the IDT electrode 3 in the direction of propagation of a surface acoustic wave. As with the IDT electrode 3, the reflectors 12 and 13 are also formed by forming a plurality of grooves in the upper surface of the LiNbO$_3$ substrate 1 and filling the grooves with a metal. Thus, the upper surface of the LiNbO$_3$ substrate 1 is substantially flat even after the electrode 3 and the reflectors 12 and 13 are formed.

Referring to FIGS. 1 and 2, a SiO$_2$ layer 4 is arranged to cover the LiNbO$_3$ substrate 1, the IDT electrode 3, and the reflectors 12 and 13.

Figure 3A:
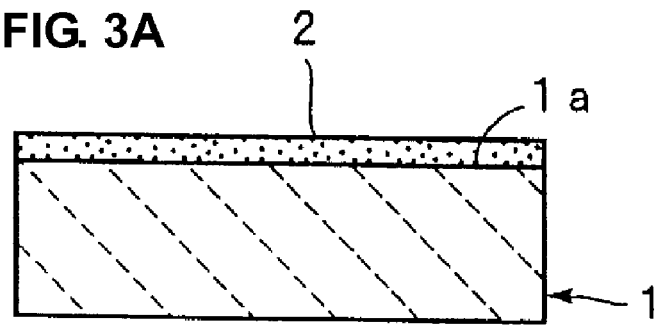
FIGS. 3A to 3E show schematic front section views to describe a method for manufacturing a surface acoustic wave device according to a preferred embodiment of the present invention.
Figure 3B:
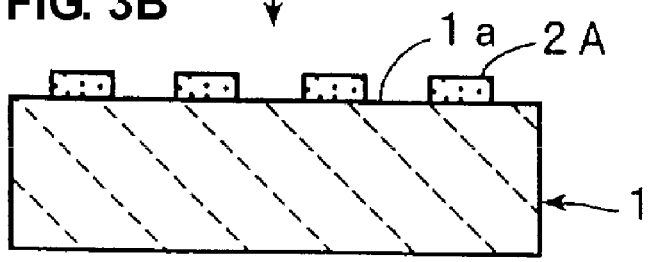
Figure 3C:
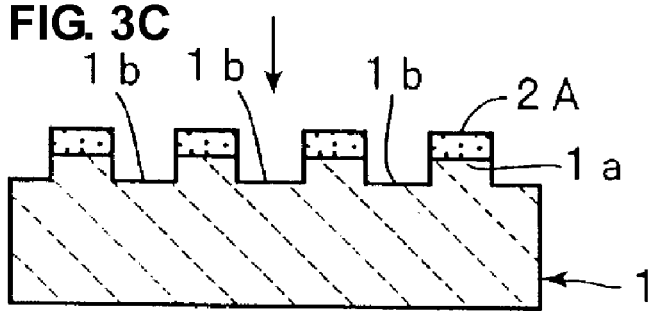
Figure 3D:
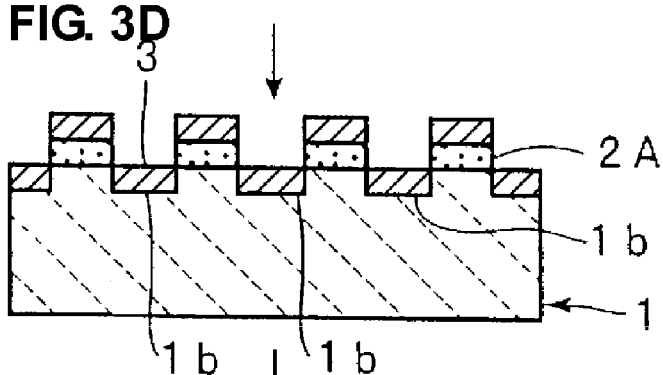
Figure 3E:
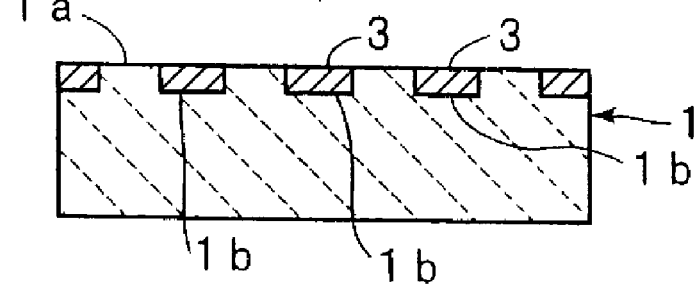

The surface acoustic wave device 1 can be manufactured through the steps shown in FIGS. 3A to 3E. Specifically, as shown in FIGS. 3A and 3B, a photoresist 2 is formed over the entire surface of the LiNbO$_3$ substrate 1 and patterned by photolithography, for example, to provide a photoresist pattern 2A. Then, as shown in FIG. 3C, the LiNbO$_3$ substrate 1 is etched to form grooves 1b. After that, as shown in FIG. 3D, a metal is deposited to a certain thickness to fill the grooves 1b with the metal and to thereby form the IDT electrode 3. The thickness of the metal is set to be substantially equal to the depth of the grooves 1b. As shown in FIG. 3E, the photoresist pattern 2A and the metal films thereon are removed by lift-off. After that, the SiO$_2$ layer 4 is formed by an appropriate film-forming process, such as vapor deposition or sputtering. As a result, the SiO$_2$ layer 4 having a substantially flat upper surface shown in FIG. 1 is formed.

The surface acoustic wave device 11 of this preferred embodiment uses a response of a Rayleigh wave as surface waves and includes a LiNbO$_3$ substrate with Euler angles in the range of (0±5°, 180° to 247°, 0°±5°) As a result, a spurious response occurring near the main response can be effectively suppressed. As described above, when the surface acoustic wave device of WO2006/011417A1 is used, a large spurious response occurs near the main response. The inventors of the present invention have performed further studies about the phenomenon and have discovered that the spurious response occurring near the main response can be effectively suppressed by utilizing a LiNbO$_3$ substrate with Euler angles in specific ranges. That is, the inventors have discovered by chance that the use of the substrates with the specific Euler angles suppresses the spurious response not based on experiments, but by chance.

Hereinafter, the fact that the use of the LiNbO$_3$ substrates with Euler angles in the specific ranges effectively suppresses the spurious response is specifically described with reference to experimental examples.

Figure 4:
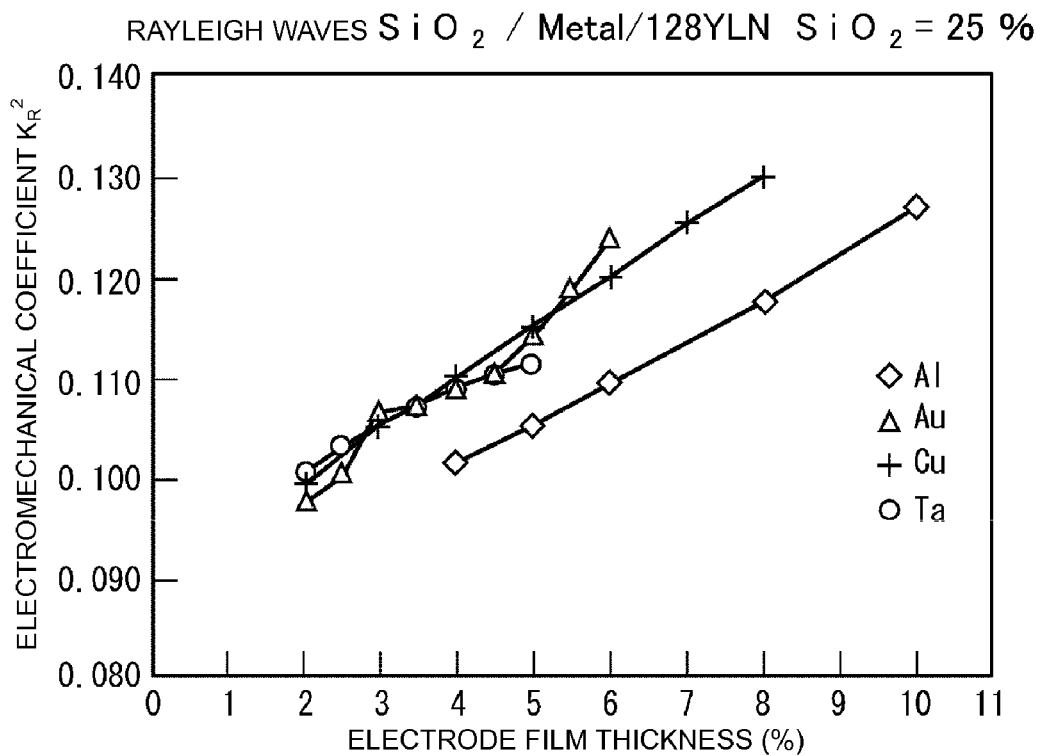
FIG. 4 is a graph showing the change in the electromechanical coefficient of Rayleigh waves when LiNbO$_3$ substrates with an Euler angle θ of about 218° are used and the material and a normalized film thickness H/λ×100(%) of electrodes are changed.

Surface acoustic wave devices were manufactured by preparing LiNbO$_3$ substrates with Euler angles (0°, 218°, 0°) as the LiNbO$_3$ substrates 1, forming the IDT electrodes and the reflectors as shown in FIGS. 1 and 2 by filling a plurality of grooves with Au, Ta, Cu, or Al, and forming the SiO$_2$ layers. In this case, the electrodes were formed to have different film thickness while the SiO$_2$ films were formed to have a thickness of h/λ that is approximately equal to about 25%. FIG. 4 shows the change in the electromechanical coefficient $K_R^2$ of Rayleigh waves in the surface acoustic wave devices.

The graph abscissa in FIG. 4 indicates the normalized film thickness h/λ×100(%) of an IDT electrode, where h represents the film thickness of the IDT electrode and λ represents a wavelength of Rayleigh waves.

FIG. 4 clearly shows that the electromechanical coefficient $K_R^2$ of Rayleigh waves increases as the normalized film thickness of an electrode made of any of the metals increases. The electromechanical coefficient $K_R^2$ of the main response caused by Rayleigh waves is at least about 0.1, which shows that a sufficiently large response can be obtained.

The inventors of the present invention have also found that, when a Rayleigh wave is utilized, an SH wave is excited and a response caused by the SH wave occurs as a spurious response near the main response.

Multiple surface acoustic wave devices were manufactured in which Y-cut X-propagation LiNbO$_3$ substrates having various Euler angles were used, Al was used to form electrodes, the normalized film thickness h/λ(%) of the electrodes was changed in the range of about 4% to about 24%, and the normalized film thickness h/λ of the SiO$_2$ layers was changed in the range of about 20% to about 35%. The electromechanical coefficient $K_R^2$ of Rayleigh waves and the electromechanical coefficient $K_{SH}^2$ of SH waves, which cause spurious responses against the main response of the Rayleigh waves, were measured for the surface acoustic wave devices. The results are shown in FIGS. 5 to 16.

Figure 5:
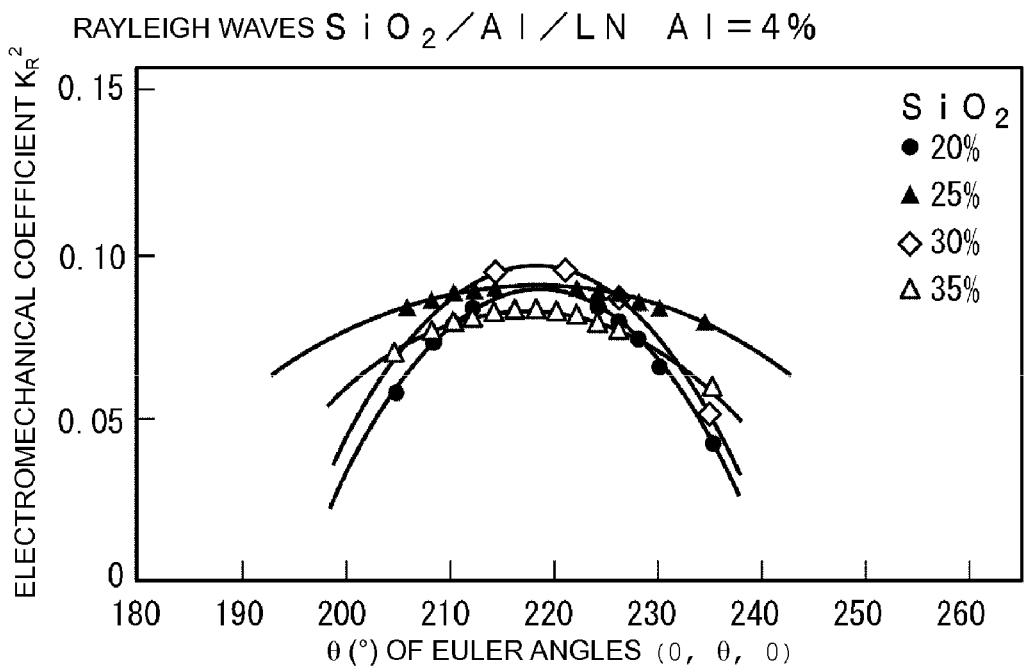
FIG. 5 is a graph showing the electromechanical coefficient $K_R^2$ of Rayleigh waves as a function of the Euler angle θ when IDT electrodes that are made of Al and have a normalized film thickness of about 4(%) are produced with grooves provided in LiNbO$_3$ substrates with Euler angles (0°, θ, 0°), and SiO$_2$ layers with various film thickness are formed on the substrates.
Figure 6:
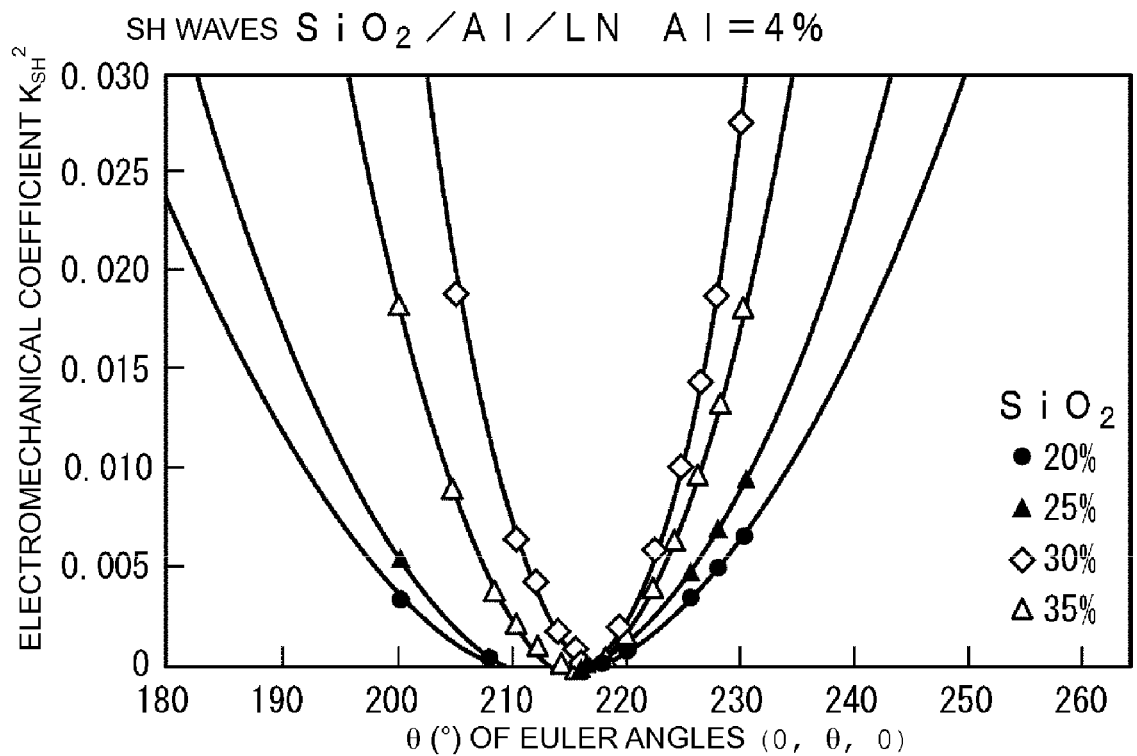
FIG. 6 is a graph showing the electromechanical coefficient $K_{SH}^2$ of SH waves as a function of the Euler angle θ when IDT electrodes that are made of Al and have a normalized film thickness of about 4(%) are produced with grooves provided in LiNbO$_3$ substrates with Euler angles (0°, θ, 0°), and SiO$_2$ layers with various film thickness are formed on the substrates.

FIG. 5 shows the electromechanical coefficient $K_R^2$ of Rayleigh waves and FIG. 6 shows the electromechanical coefficient $K_{SH}^2$ of SH waves when the IDT electrodes made of Al have a normalized film thickness (%) of about 4%.

FIGS. 5 and 6 clearly show the following finding when the IDT electrodes made of Al have a normalized film thickness of about 4%. The electromechanical coefficient $K_R^2$ of the main response caused by Rayleigh waves is in the range including values of at least about 0.08 when the Euler angle θ is in the range of about 201° to about 235°, although the values depend on the thickness of the SiO$_2$ film. The electromechanical coefficient $K_{SH}^2$ of SH waves which cause spurious responses is in a range less than about 0.02 when the Euler angle θ is in the range of about 188° to about 240°, although the values depend on the thickness of the SiO$_2$ film.

Figure 7:
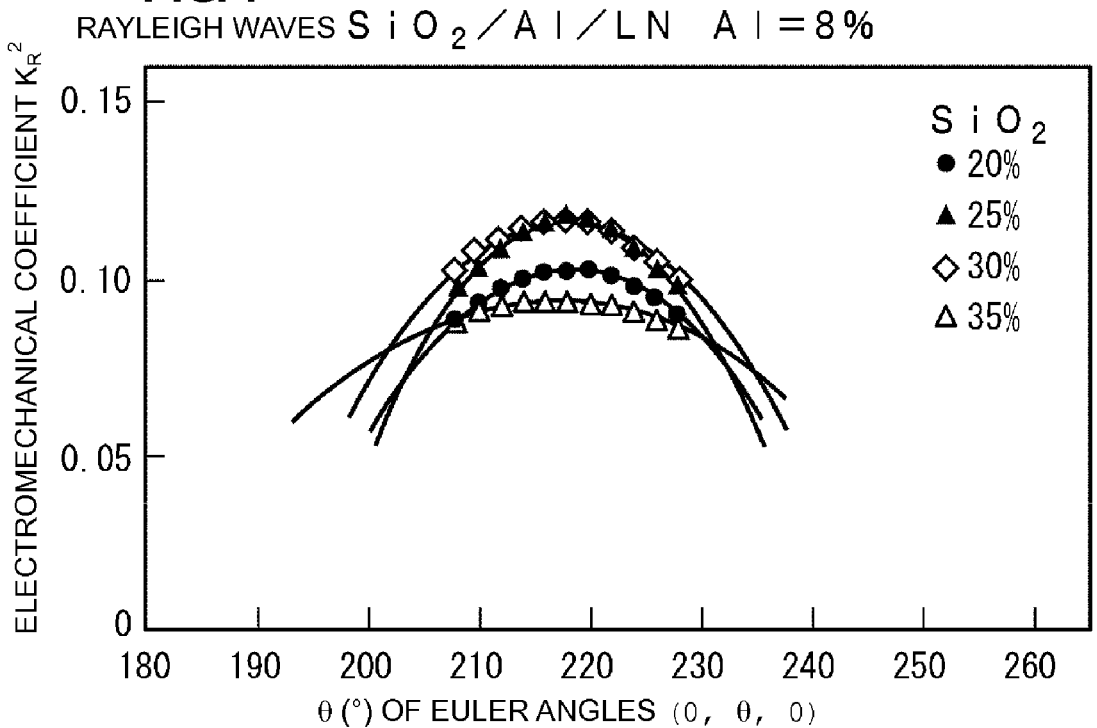
FIG. 7 is a graph showing the electromechanical coefficient $K_R^2$ of Rayleigh waves as a function of the Euler angle θ when IDT electrodes that are made of Al and have a normalized film thickness of about 8% are produced with grooves provided in LiNbO$_3$ substrates with Euler angles (0°, θ, 0°), and SiO$_2$ layers with various film thickness are formed on the substrates.
Figure 8:
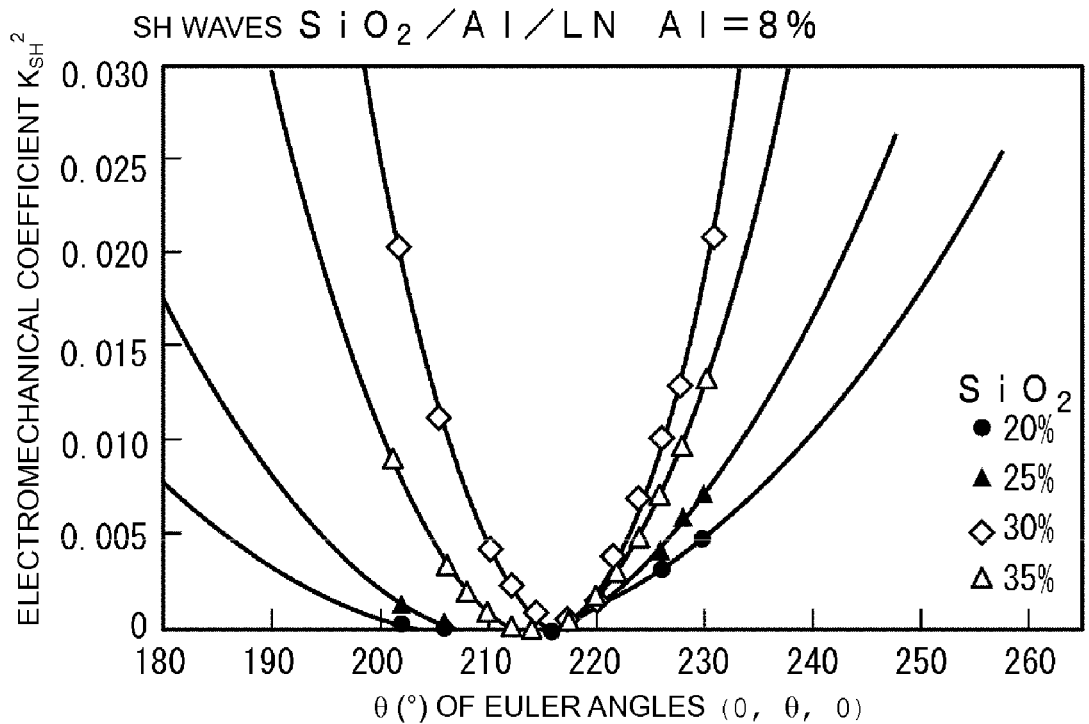
FIG. 8 is a graph showing the electromechanical coefficient $K_{SH}^2$ of SH waves as a function of the Euler angle θ when IDT electrodes that are made of Al and have a normalized film thickness of about 8% are produced with grooves provided in LiNbO$_3$ substrates with Euler angles (0°, θ, 0°), and SiO$_2$ layers with various film thickness are formed on the substrates.

FIG. 7 shows a relationship among the electromechanical coefficient $K_R^2$ of Rayleigh waves and the Euler angle θ and the normalized film thickness of the SiO$_2$ film and FIG. 8 shows a relationship among the electromechanical coefficient $K_{SH}^2$ of SH waves and the Euler angle θ and the normalized film thickness of the SiO$_2$ film when the IDT electrodes made of Al have a normalized film thickness H/λ of about 8%.

Figure 9:
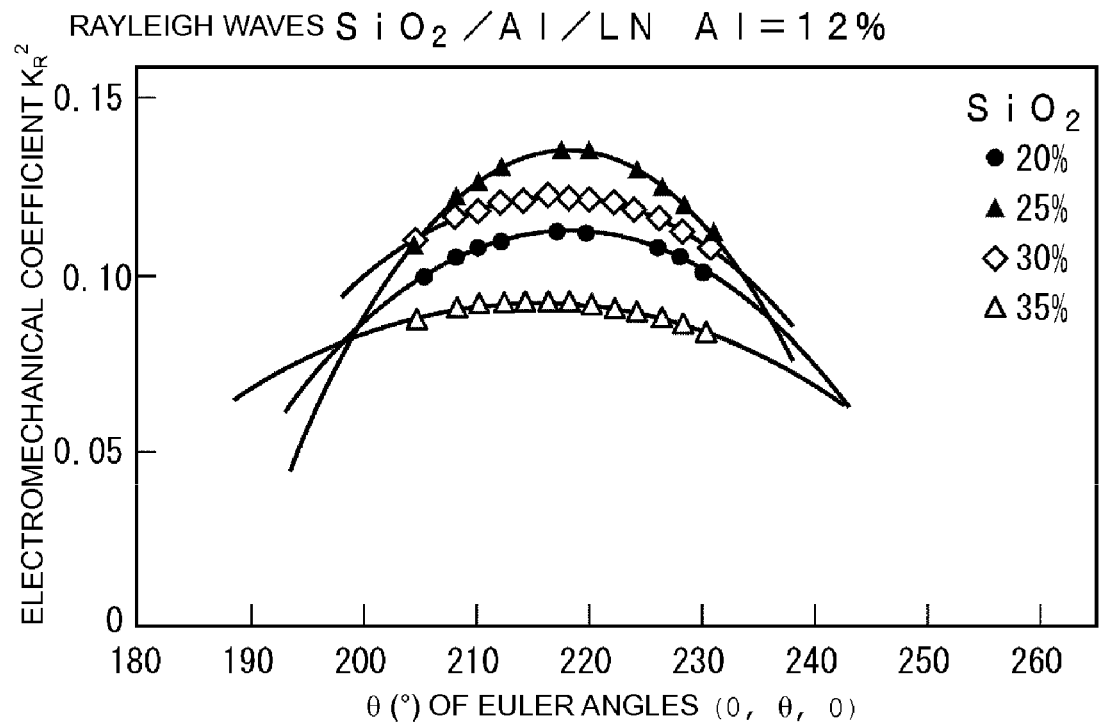
FIG. 9 is a graph showing the electromechanical coefficient $K_R^2$ of Rayleigh waves as a function of the Euler angle θ when IDT electrodes that are made of Al and have a normalized film thickness of about 12% are produced with grooves provided in LiNbO$_3$ substrates with Euler angles (0°, θ, 0°), and SiO$_2$ layers with various film thickness are formed on the substrates.
Figure 10:
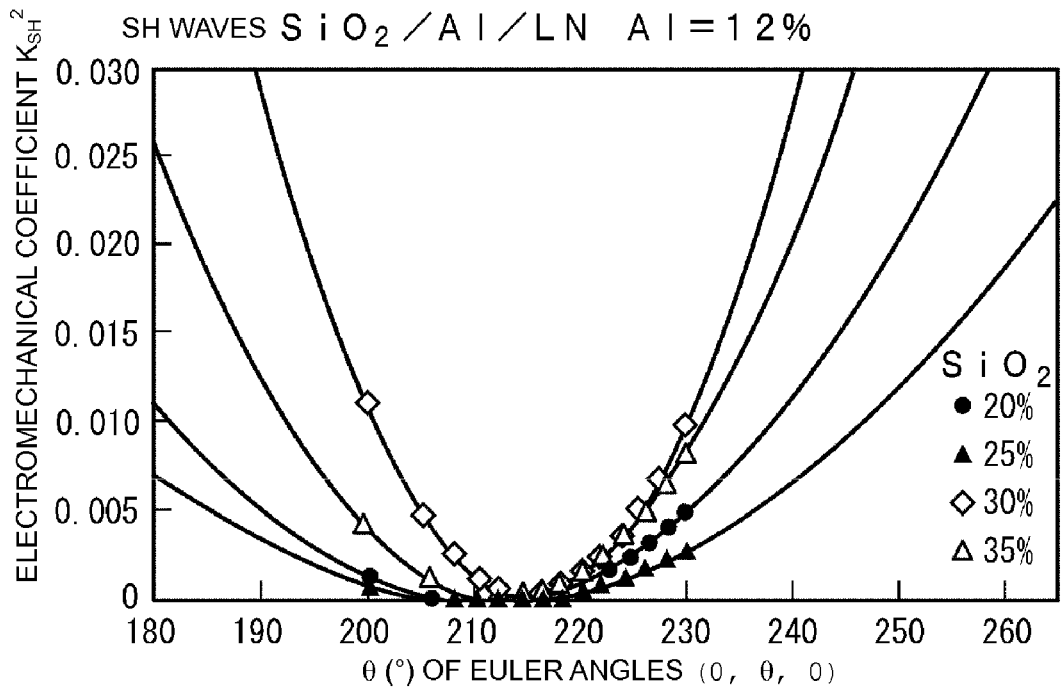
FIG. 10 is a graph showing the electromechanical coefficient $K_{SH}^2$ of SH waves as a function of the Euler angle θ when IDT electrodes that are made of Al and have a normalized film thickness of about 12% are produced with grooves provided in LiNbO$_3$ substrates with Euler angles (0°, θ, 0°), and SiO$_2$ layers with various film thickness are formed on the substrates.

FIG. 9 shows a relationship among the electromechanical coefficient $K_R^2$ of Rayleigh waves and the Euler angle θ and the normalized film thickness of the SiO$_2$ film and FIG. 10 shows a relationship among the electromechanical coefficient $K_{SH}^2$ of SH waves and the Euler angle θ and the normalized film thickness of the SiO$_2$ film when the IDT electrodes made of Al have a normalized film thickness of about 12%.

Figure 11:
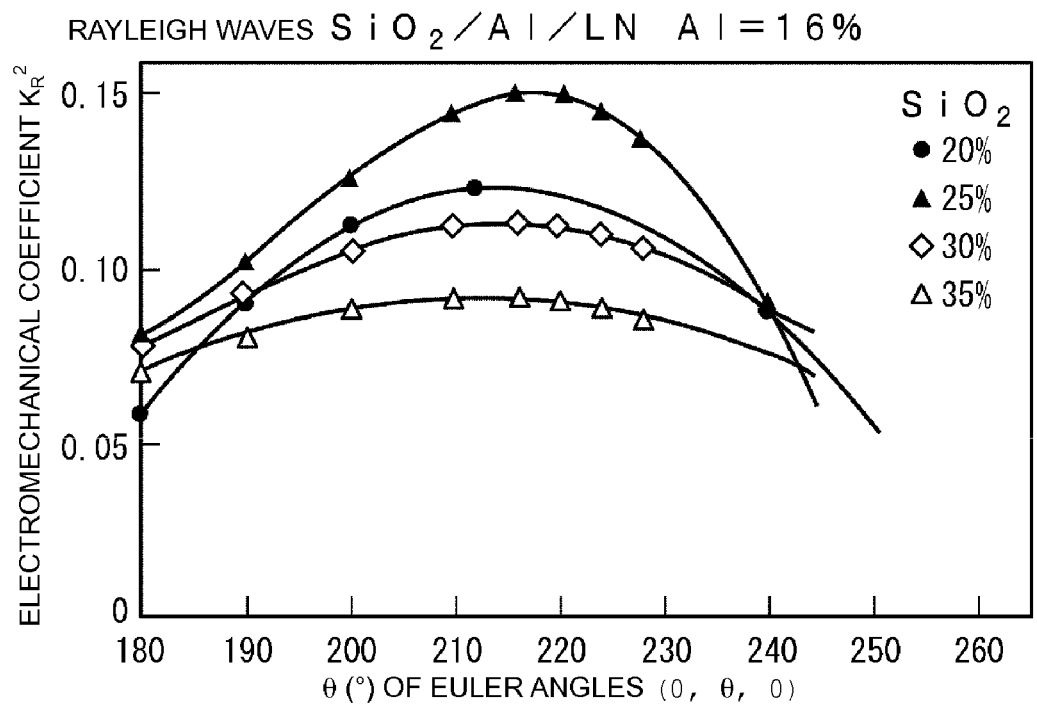
FIG. 11 is a graph showing the electromechanical coefficient $K_R^2$ of Rayleigh waves as a function of the Euler angle θ when IDT electrodes that are made of Al and have a normalized film thickness of about 16% are produced with grooves provided in LiNbO$_3$ substrates with Euler angles (0°, θ, 0°), and SiO$_2$ layers with various film thickness are formed on the substrates.
Figure 12:
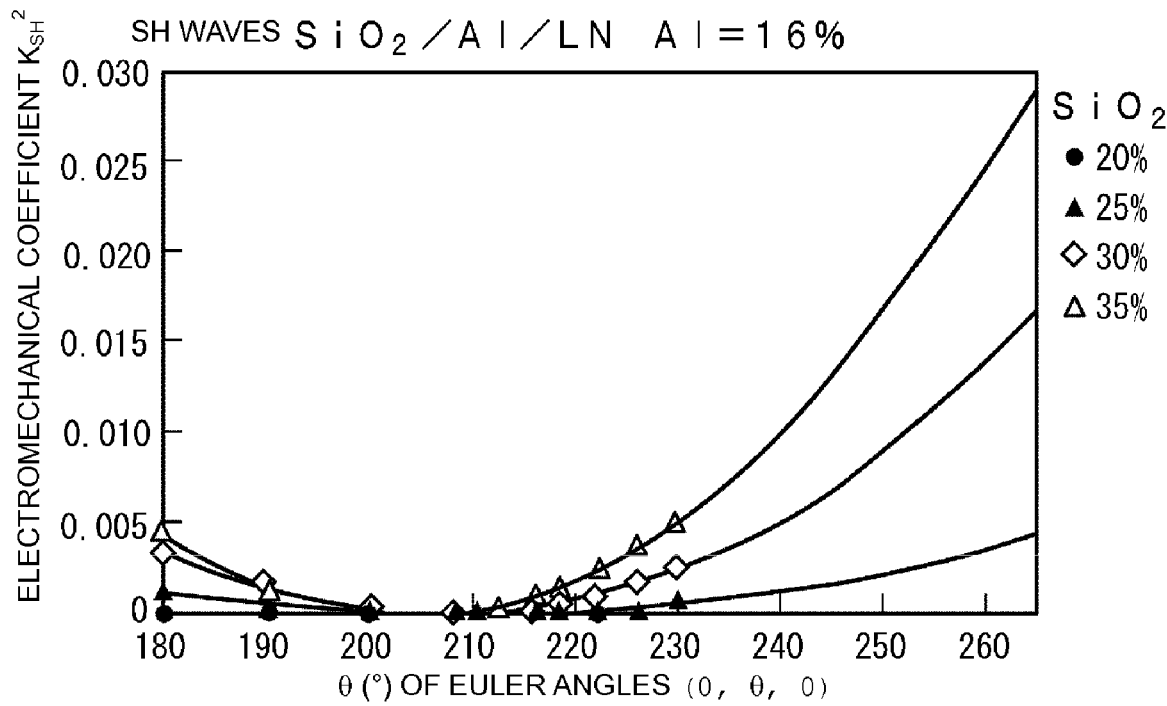
FIG. 12 is a graph showing the electromechanical coefficient $K_{SH}^2$ of SH waves as a function of the Euler angle θ when IDT electrodes that are made of Al and have a normalized film thickness of about 16% are produced with grooves provided in LiNbO$_3$ substrates with Euler angles (0°, θ, 0°), and SiO$_2$ layers with various film thickness are formed on the substrates.

FIG. 11 shows a relationship among the electromechanical coefficient $K_R^2$ of Rayleigh waves and the Euler angle θ and the normalized film thickness of the SiO$_2$ film and FIG. 12 shows a relationship among the electromechanical coefficient $K_{SH}^2$ of SH waves and the Euler angle θ and the normalized film thickness of the SiO$_2$ film when the IDT electrodes made of Al have a normalized film thickness of about 16%.

Figure 13:
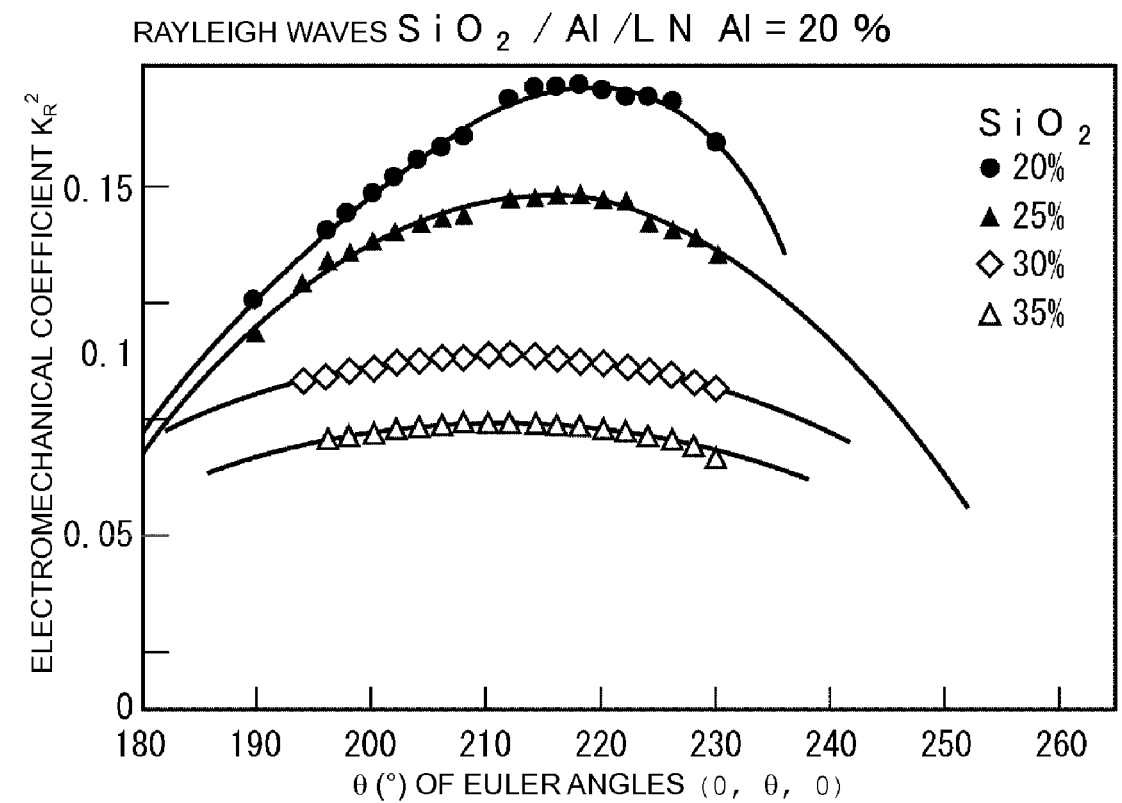
FIG. 13 is a graph showing the electromechanical coefficient $K_R^2$ of Rayleigh waves as a function of the Euler angle θ when IDT electrodes that are made of Al and have a normalized film thickness of about 20% are produced with grooves provided in LiNbO$_3$ substrates with Euler angles (0°, θ, 0°), and SiO$_2$ layers with various film thickness are formed on the substrates.
Figure 14:
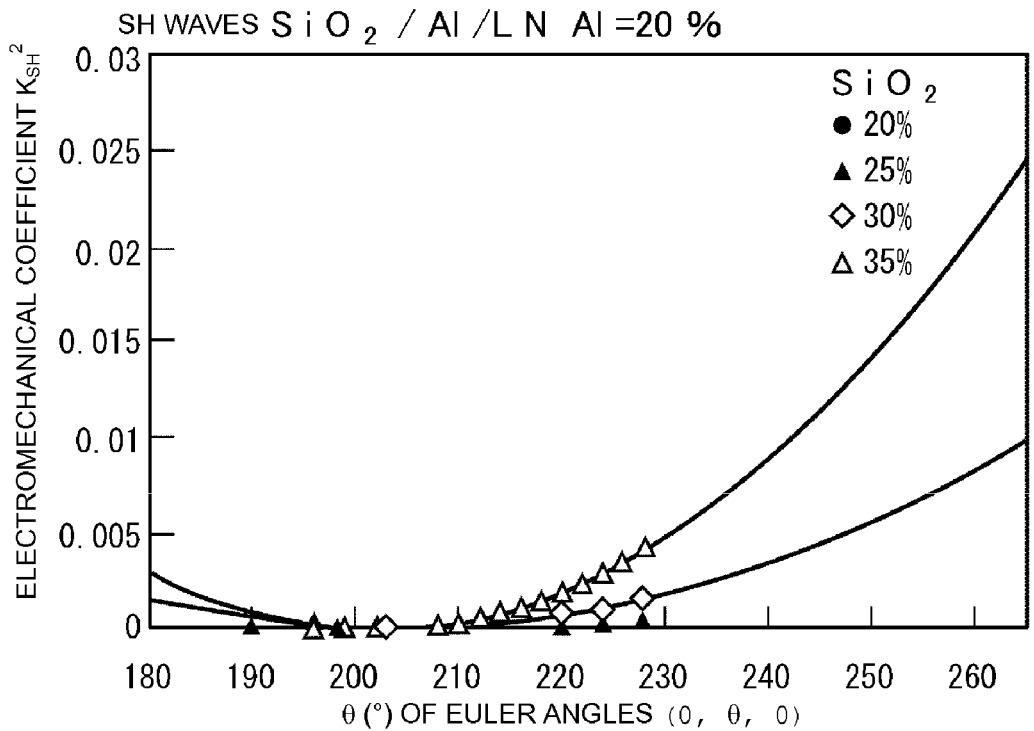
FIG. 14 is a graph showing the electromechanical coefficient $K_{SH}^2$ of SH waves as a function of the Euler angle θ when IDT electrodes that are made of Al and have a normalized film thickness of about 20% are produced with grooves provided in LiNbO$_3$ substrates with Euler angles (0°, θ, 0°), and SiO$_2$ layers with various film thickness are formed on the substrates.

FIG. 13 shows a relationship among the electromechanical coefficient $K_R^2$ of Rayleigh waves and the Euler angle θ and the normalized film thickness of the SiO$_2$ film and FIG. 14 shows a relationship among the electromechanical coefficient $K_{SH}^2$ of SH waves and the Euler angle θ and the normalized film thickness of the SiO$_2$ film when the IDT electrodes made of Al have a normalized film thickness of about 20%.

Figure 15:
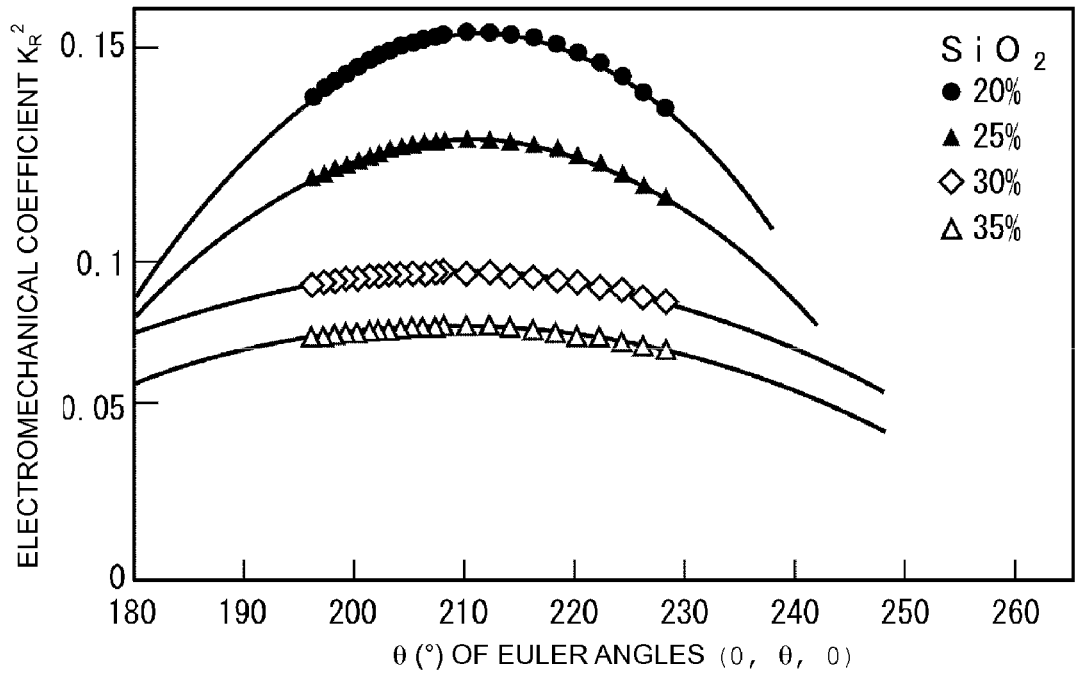
FIG. 15 is a graph showing the electromechanical coefficient $K_R^2$ of Rayleigh waves as a function of the Euler angle θ when IDT electrodes that are made of Al and have a normalized film thickness of about 24% are produced with grooves provided in LiNbO$_3$ substrates with Euler angles (0°, θ, 0°), and SiO$_2$ layers with various film thickness are formed on the substrates.
Figure 16:
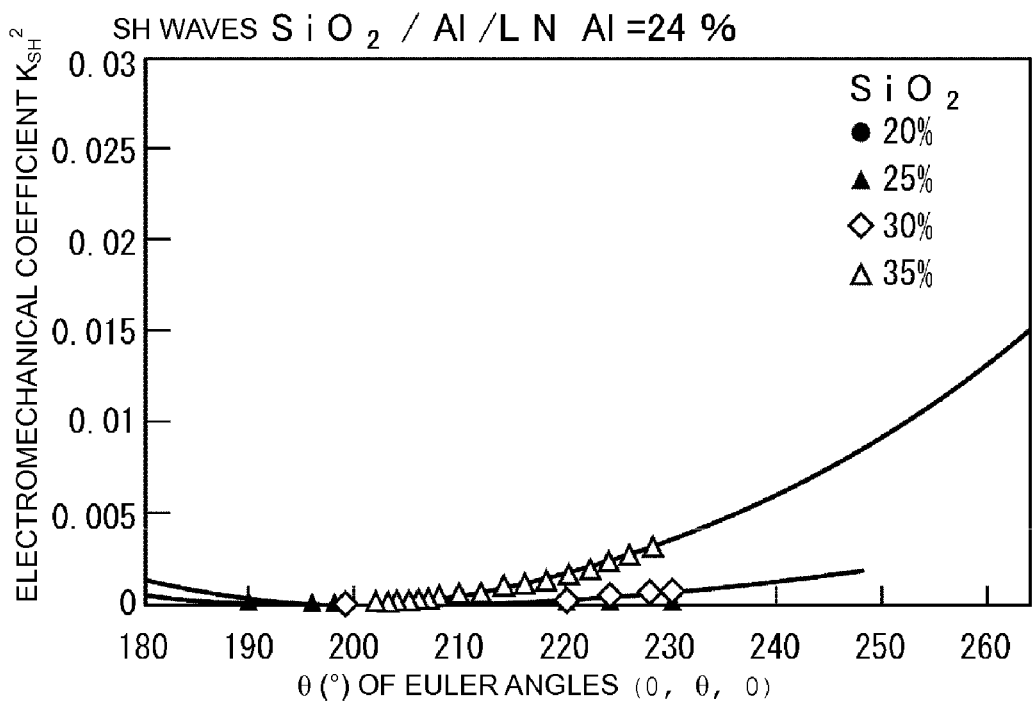
FIG. 16 is a graph showing the electromechanical coefficient $K_{SH}^2$ of SH waves as a function of the Euler angle θ when IDT electrodes that are made of Al and have a normalized film thickness of about 24% are produced with grooves provided in LiNbO$_3$ substrates with Euler angles (0°, θ, 0°), and SiO$_2$ layers with various film thickness are formed on the substrates.

FIG. 15 shows a relationship among the electromechanical coefficient $K_R^2$ of Rayleigh waves and the Euler angle θ and the normalized film thickness of the SiO$_2$ film and FIG. 16 shows a relationship among the electromechanical coefficient $K_{SH}^2$ of SH waves and the Euler angle θ and the normalized film thickness of the SiO$_2$ film when the IDT electrodes made of Al have a normalized film thickness of about 24%.

As shown in FIGS. 5 to 16, as long as the Al films have a normalized film thickness in the range of about 4% to about 24% and the SiO$_2$ films have a normalized film thickness in the range of about 20% to about 35%, the electromechanical coefficient $K_R^2$ of Rayleigh waves has a maximum value at an Euler angle θ in the range of about 210° to about 230° irrespective of the film thickness. Furthermore, the electromechanical coefficient $K_R^2$ tends to decrease as the Euler angle θ decreases from the angle corresponding to the maximum value, and the electromechanical coefficient $K_R^2$ also tends to decrease as the Euler angle θ increases from the angle corresponding to the maximum value.

In contrast, the electromechanical coefficient $K_{SH}^2$ of the SH waves which cause spurious responses have a minimum value in the range in which the Euler angle θ is about 200° to about 230°.

The results in FIGS. 5 to 16 show that the combinations shown in Table 9 below provide an Euler angle θ at which the main response caused by Rayleigh waves has an electromechanical coefficient $K_R^2$ of at least about 0.08, which provides a sufficient response, and SH waves, which cause spurious responses, have an electromechanical coefficient $K_{SH}^2$ of less than about 0.02. Thus, to achieve the main response caused by Rayleigh waves having an electromechanical coefficient $K_R^2$ of at least about 0.08 and SH waves, which cause spurious responses, having an electromechanical coefficient $K_{SH}^2$ of less than about 0.02, the Euler angle θ should be selected in accordance with Table 9 below.

Surface acoustic wave resonators or surface acoustic wave filters in which the main response caused by Rayleigh waves has an electromechanical coefficient $K_R^2$ of at least about 0.08 have good resonance characteristics and filter characteristics. In this case, when SH waves have an electromechanical coefficient $K_{SH}^2$ of at least about 0.02, spurious responses caused by the SH waves are no longer negligible and degrade the resonance characteristics and/or the filter characteristics.

Thus, as shown in Table 9, by selecting a combination of a normalized film thickness (%) range of the IDT electrode made of Al, a normalized film thickness (%) range of the SiO$_2$ film, and an Euler angle θ (°) range in the rightmost column in Table 9, the main response caused by Rayleigh waves that are used has an electromechanical coefficient of at least about 0.08, which provides a sufficient response. Moreover, SH waves, which cause spurious responses, have an electromechanical coefficient of less than about 0.02, thereby effectively suppressing influences caused by spurious responses.

As shown in FIGS. 5 to 16 and Table 9, when the Euler angle θ is in the range of about 180° to about 247°, Rayleigh waves that are used have a sufficiently high electromechanical coefficient $K_R^2$ while SH waves have a relatively low electromechanical coefficient $K_{SH}^2$ by appropriately selecting the normalized film thickness of the IDT electrode and the normalized film thickness of the $SiO_2$ film, thereby effectively suppressing spurious responses caused by the SH waves.

TABLE 9

| *IDT electrode | Thickness of $SiO_2$ film | Cut angle achieving $K_R^2 > 0.08$ | Cut angle achieving $K_{SH}^2 < 0.02$ | $K_R^2 > 0.08$ and $K_{SH}^2 < 0.02$ |
|---|---|---|---|---|
| 2% < h/λ ≦ 6% | 17.5% < h/λ ≦ 22.5% | 210~228 | 182~240 | 210~228 |
| | 22.5% < h/λ ≦ 27.5% | 201~235 | 188~238 | 201~235 |
| | 27.5% < h/λ ≦ 32.5% | 207~229 | 205~229 | 207~229 |
| | 32.5% < h/λ ≦ 37.5% | 210~225 | 199~232 | 210~225 |
| 6% < h/λ ≦ 10% | 17.5% < h/λ ≦ 22.5% | 205~231 | 170~252 | 205~231 |
| | 22.5% < h/λ ≦ 27.5% | 204~232 | 177~243 | 204~232 |
| | 27.5% < h/λ ≦ 32.5% | 202~231 | 202~231 | 202~231 |
| | 32.5% < h/λ ≦ 37.5% | 202~232 | 194~234 | 202~232 |
| 10% < h/λ ≦ 14% | 17.5% < h/λ ≦ 22.5% | 197~239 | 170~250 | 197~239 |
| | 22.5% < h/λ ≦ 27.5% | 198~238 | 160~262 | 198~238 |
| | 27.5% < h/λ ≦ 32.5% | 194~240 | 194~236 | 194~236 |
| | 32.5% < h/λ ≦ 37.5% | 197~233 | 184~240 | 197~233 |
| 14% < h/λ ≦ 18% | 17.5% < h/λ ≦ 22.5% | 187~243 | ***Throughout the experimental range | 187~243 |
| | 22.5% < h/λ ≦ 27.5% | 181~242 | ***Throughout the experimental range | 181~242 |
| | 27.5% < h/λ ≦ 32.5% | 181~247 | ***Throughout the experimental range | 181~247 |
| | 32.5% < h/λ ≦ 37.5% | 188~236 | ***Throughout the experimental range | 188~236 |
| 18% < h/λ ≦ 22% | 17.5% < h/λ ≦ 22.5% | 180~242 | ***Throughout the experimental range | 180~242 |
| | 22.5% < h/λ ≦ 27.5% | 182~246 | ***Throughout the experimental range | 182~246 |
| | 27.5% < h/λ ≦ 32.5% | 184~238 | ***Throughout the experimental range | 184~238 |
| | 32.5% < h/λ ≦ 37.5% | 208~212 | ***Throughout the experimental range | 208~212 |
| 22% < h/λ ≦ 26% | 17.5% < h/λ ≦ 22.5% | 180~243 | ***Throughout the experimental range | 180~243 |
| | 22.5% < h/λ ≦ 27.5% | 181~240 | ***Throughout the experimental range | 181~240 |
| | 27.5% < h/λ ≦ 32.5% | 191~227 | ***Throughout the experimental range | 191~227 |
| | 32.5% < h/λ ≦ 37.5% | **No range | ***Throughout the experimental range | **No range |

*IDT electrode (primarily containing Al)
**No range achieving $K_R^2 > 0.08$
*** $K_{SH}^2 < 0.02$ achieved throughout the experimental range Referring to Table 10 below, SH waves, which cause spurious responses, more preferably have an electromechanical coefficient $K_{SH}^2$ of less than about 0.01 by selecting any combination of ranges in Table 10.

TABLE 10

| *IDT electrode | Thickness of $SiO_2$ film | Cut angle achieving $K_R^2 > 0.08$ | Cut angle achieving $K_{SH}^2 < 0.01$ | $K_R^2 > 0.08$ and $K_{SH}^2 < 0.01$ |
|---|---|---|---|---|
| 2% < h/λ ≦ 6% | 17.5% < h/λ ≦ 22.5% | 210~228 | 191~234 | 210~228 |
| | 22.5% < h/λ ≦ 27.5% | 201~235 | 195~231 | 201~231 |
| | 27.5% < h/λ ≦ 32.5% | 207~229 | 208~225 | 208~225 |
| | 32.5% < h/λ ≦ 37.5% | 210~225 | 204~226 | 210~225 |
| 6% < h/λ ≦ 10% | 17.5% < h/λ ≦ 22.5% | 205~231 | 178~239 | 205~231 |
| | 22.5% < h/λ ≦ 27.5% | 204~232 | 187~233 | 204~232 |
| | 27.5% < h/λ ≦ 32.5% | 202~231 | 206~226 | 206~226 |
| | 32.5% < h/λ ≦ 37.5% | 202~232 | 200~228 | 202~228 |
| 10% < h/λ ≦ 14% | 17.5% < h/λ ≦ 22.5% | 197~239 | 181~238 | 197~239 |
| | 22.5% < h/λ ≦ 27.5% | 198~238 | 172~248 | 198~238 |
| | 27.5% < h/λ ≦ 32.5% | 194~240 | 200~230 | 200~230 |
| | 32.5% < h/λ ≦ 37.5% | 197~233 | 192~233 | 197~333 |
| 14% < h/λ ≦ 18% | 17.5% < h/λ ≦ 22.5% | 187~243 | ***Throughout the experimental range | 187~243 |
| | 22.5% < h/λ ≦ 27.5% | 181~242 | ***Throughout the experimental range | 181~242 |
| | 27.5% < h/λ ≦ 32.5% | 181~247 | ***Throughout the experimental range | 181~247 |
| | 32.5% < h/λ ≦ 37.5% | 188~236 | ***Throughout the experimental range | 188~236 |
| 18% < h/λ ≦ 22% | 17.5% < h/λ ≦ 22.5% | 180~242 | ***Throughout the experimental range | 180~242 |
| | 22.5% < h/λ ≦ 27.5% | 182~246 | ***Throughout the experimental range | 182~246 |
| | 27.5% < h/λ ≦ 32.5% | 184~238 | ***Throughout the experimental range | 184~238 |
| | 32.5% < h/λ ≦ 37.5% | 208~212 | ***Throughout the experimental range | 208~212 |
| 22% < h/λ ≦ 26% | 17.5% < h/λ ≦ 22.5% | 180~243 | ***Throughout the experimental range | 180~243 |
| | 22.5% < h/λ ≦ 27.5% | 181~240 | ***Throughout the experimental range | 181~240 |
| | 27.5% < h/λ ≦ 32.5% | 191~227 | ***Throughout the experimental range | 191~227 |
| | 32.5% < h/λ ≦ 37.5% | **No range | ***Throughout the experimental range | **No range |

*IDT electrode (primarily containing Al)
**No range achieving $K_R^2 > 0.08$
*** $K_{SH}^2 < 0.01$ achieved throughout the experimental range Multiple surface acoustic wave devices were manufactured in which Y-cut X-propagation LiNbO$_3$ substrates having various Euler angles were used, Au was used to form electrodes, the normalized film thickness h/λ(%) of the electrodes was changed in the range of about 2% to about 4%, and the normalized film thickness h/λ of the SiO$_2$ layers was changed in the range of about 20% to about 40%. The electromechanical coefficient $K_R^2$ of Rayleigh waves and the electromechanical coefficient $K_{SH}^2$ of SH waves, which cause spurious responses against the main response of the Rayleigh waves, were measured for the surface acoustic wave devices. The results are shown in FIGS. 17 to 24.

Figure 17:
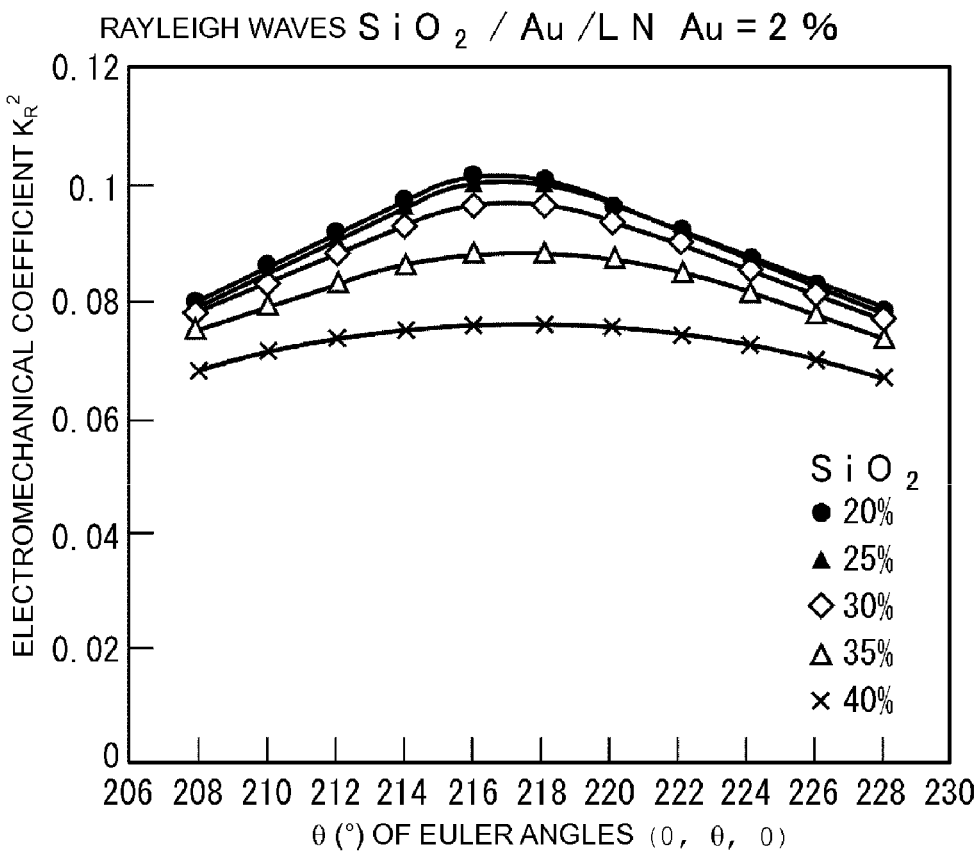
FIG. 17 is a graph showing the electromechanical coefficient $K_R^2$ of Rayleigh waves as a function of the Euler angle θ when IDT electrodes that are made of Au and have a normalized film thickness of about 2% are produced with grooves provided in LiNbO$_3$ substrates with Euler angles (0°, θ, 0°), and SiO$_2$ layers with various film thickness are formed on the substrates.
Figure 18:
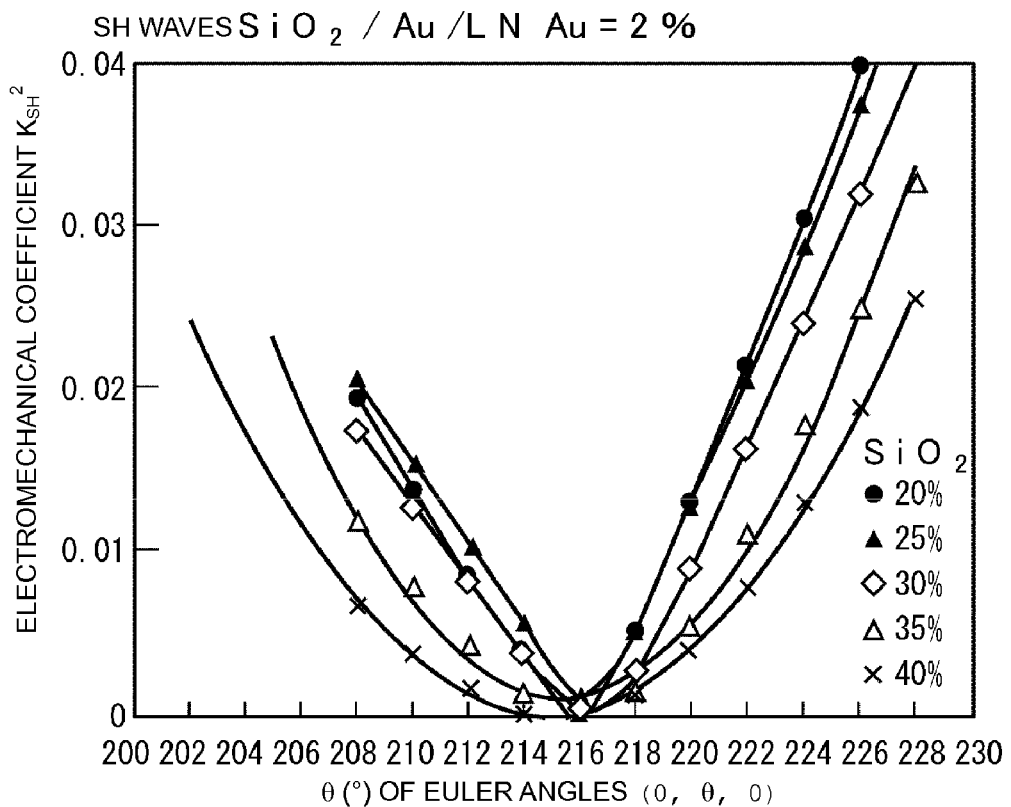
FIG. 18 is a graph showing the electromechanical coefficient $K_{SH}^2$ of SH waves as a function of the Euler angle θ when IDT electrodes that are made of Au and have a normalized film thickness of about 2% are produced with grooves provided in LiNbO$_3$ substrates with Euler angles (0°, θ, 0°), and SiO$_2$ layers with various film thickness are formed on the substrates.

FIG. 17 shows the electromechanical coefficient $K_R^2$ of Rayleigh waves and FIG. 18 shows the electromechanical coefficient $K_{SH}^2$ of SH waves when the IDT electrodes made of Au have a normalized film thickness (%) of about 2%.

FIGS. 17 and 18 clearly show the following finding when the IDT electrodes made of Au have a normalized film thickness of about 2%. The electromechanical coefficient $K_R^2$ of the main response caused by Rayleigh waves is in the range of at least about 0.08 when the Euler angle θ is in the range of about 208° to about 228°, although the values depend on the thickness of the SiO$_2$ film. The electromechanical coefficient $K_{SH}^2$ of SH waves, which cause spurious responses, is in the range of less than about 0.02 when the Euler angle θ is in the range of about 203° to about 227°, although the values depend on the thickness of the SiO$_2$ film.

Figure 19:
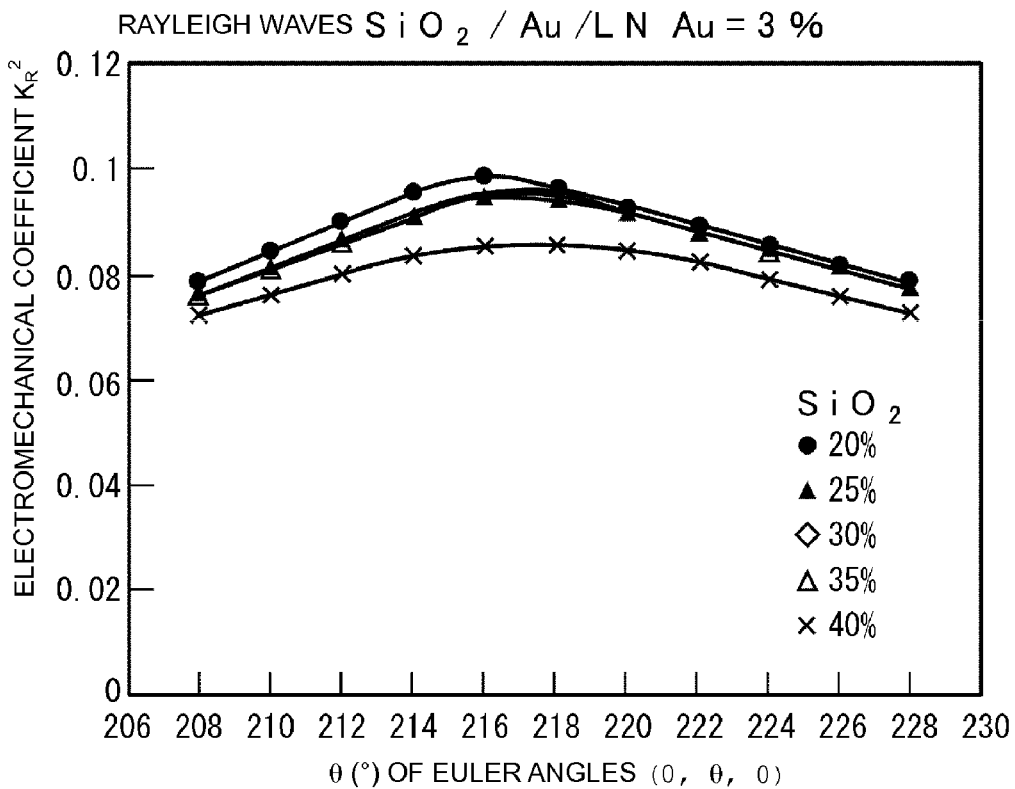
FIG. 19 is a graph showing the electromechanical coefficient $K_R^2$ of Rayleigh waves as a function of the Euler angle θ when IDT electrodes that are made of Au and have a normalized film thickness of about 3% are produced with grooves provided in LiNbO$_3$ substrates with Euler angles (0°, θ, 0°), and SiO$_2$ layers with various film thickness are formed on the substrates.
Figure 20:
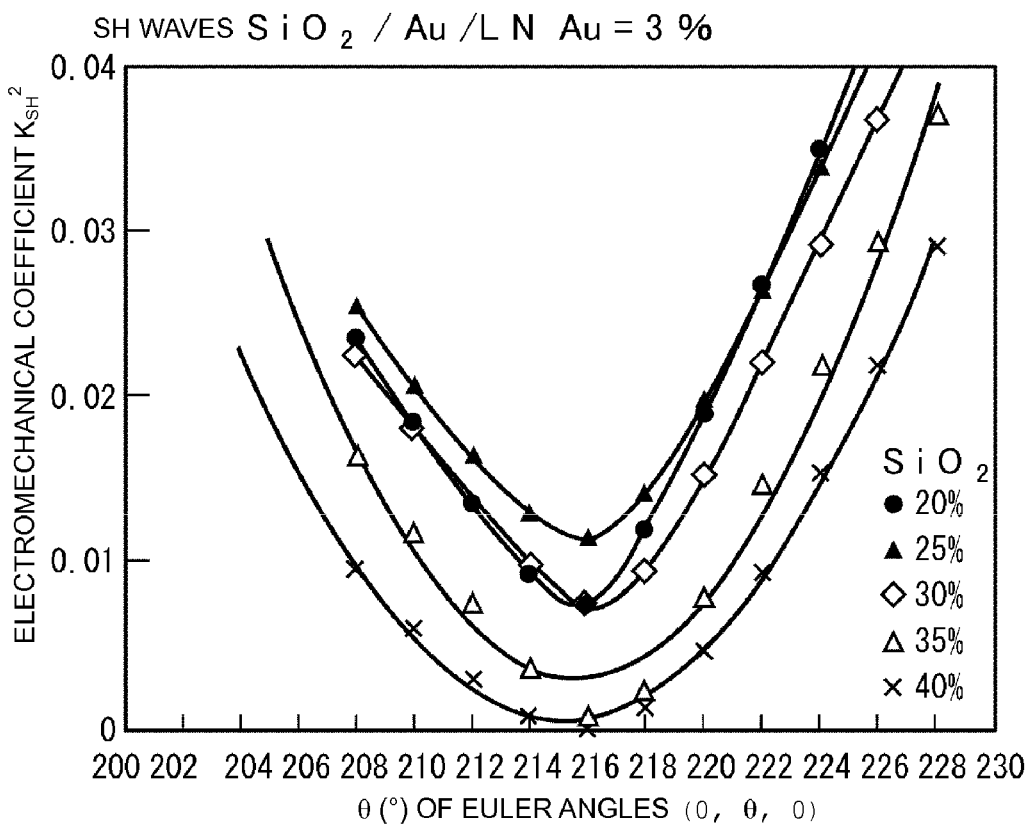
FIG. 20 is a graph showing the electromechanical coefficient $K_{SH}^2$ of SH waves as a function of the Euler angle θ when IDT electrodes that are made of Au and have a normalized film thickness of about 3% are produced with grooves provided in LiNbO$_3$ substrates with Euler angles (0°, θ, 0°), and SiO$_2$ layers with various film thickness are formed on the substrates.

FIG. 19 shows a relationship among the electromechanical coefficient $K_R^2$ of Rayleigh waves and the Euler angle θ and the normalized film thickness of the SiO$_2$ film and FIG. 20 shows a relationship among the electromechanical coefficient $K_{SH}^2$ of SH waves and the Euler angle θ and the normalized film thickness of the SiO$_2$ film when the IDT electrodes made of Au have a normalized film thickness H/λ of about 3%.

Figure 21:
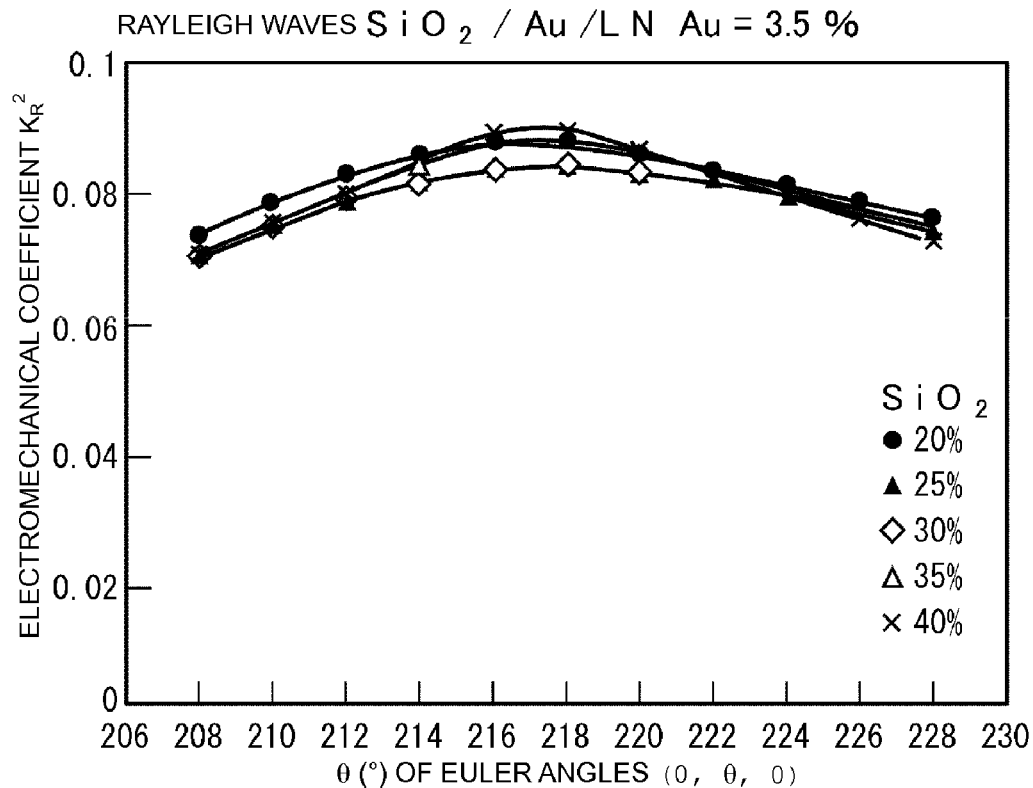
FIG. 21 is a graph showing the electromechanical coefficient $K_R^2$ of Rayleigh waves as a function of the Euler angle θ when IDT electrodes that are made of Au and have a normalized film thickness of about 3.5% are produced with grooves provided in LiNbO$_3$ substrates with Euler angles (0°, 0, 0°), and SiO$_2$ layers with various film thickness are formed on the substrates.
Figure 22:
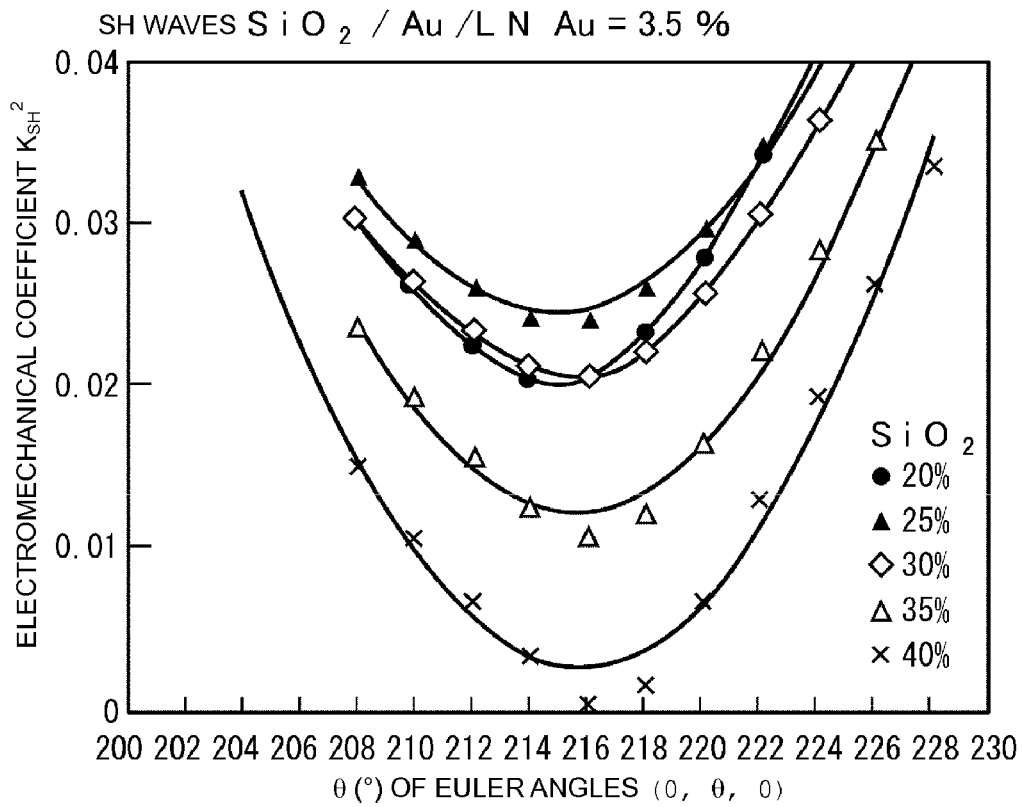
FIG. 22 is a graph showing the electromechanical coefficient $K_{SH}^2$ of SH waves as a function of the Euler angle θ when IDT electrodes that are made of Au and have a normalized film thickness of about 3.5% are produced with grooves provided in LiNbO$_3$ substrates with Euler angles (0°, θ, 0°), and SiO$_2$ layers with various film thickness are formed on the substrates.

FIG. 21 shows a relationship among the electromechanical coefficient $K_R^2$ of Rayleigh waves and the Euler angle θ and the normalized film thickness of the SiO$_2$ film and FIG. 22 shows a relationship among the electromechanical coefficient $K_{SH}^2$ of SH waves and the Euler angle θ and the normalized film thickness of the SiO$_2$ film when the IDT electrodes made of Au have a normalized film thickness of about 3.5%.

Figure 23:
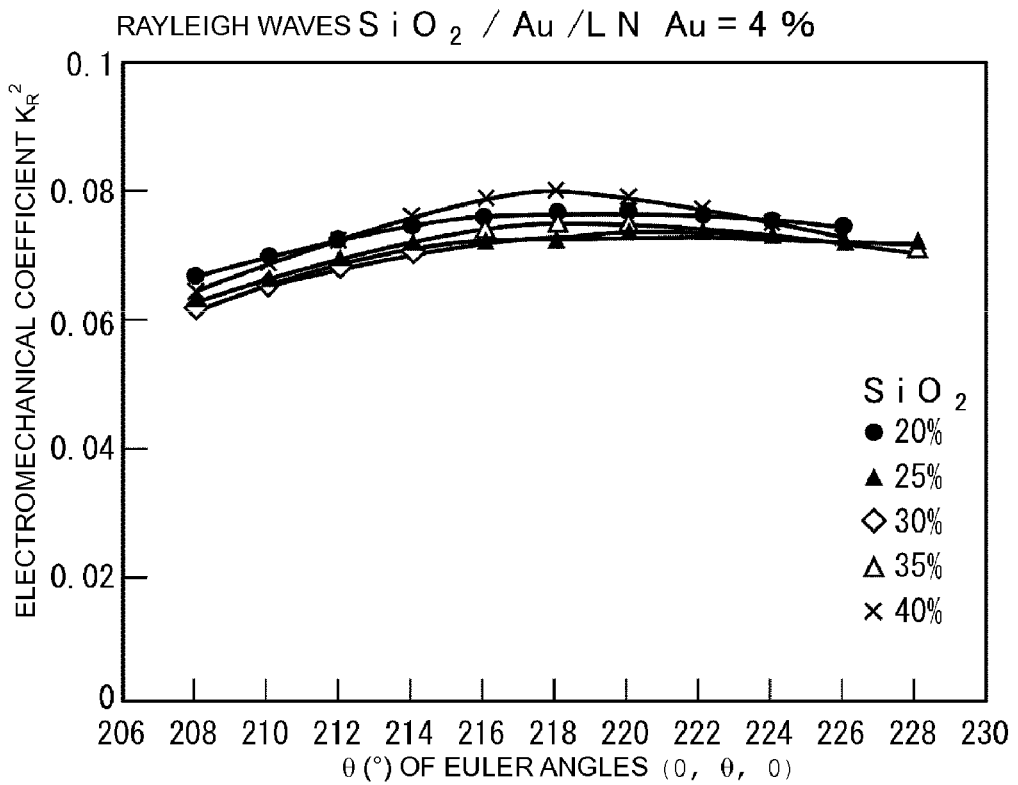
FIG. 23 is a graph showing the electromechanical coefficient $K_R^2$ of Rayleigh waves as a function of the Euler angle θ when IDT electrodes that are made of Au and have a normalized film thickness of about 4% are produced with grooves provided in LiNbO$_3$ substrates with Euler angles (0°, θ, 0°), and SiO$_2$ layers with various film thickness are formed on the substrates.
Figure 24:
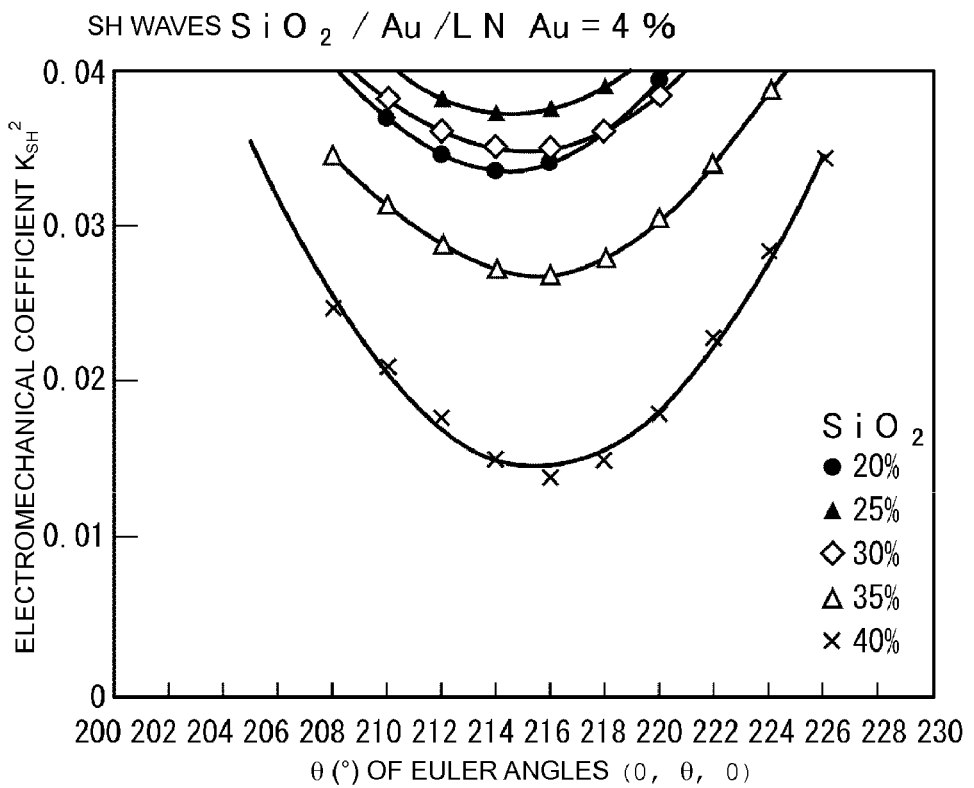
FIG. 24 is a graph showing the electromechanical coefficient $K_{SH}^2$ of SH waves as a function of the Euler angle θ when IDT electrodes that are made of Au and have a normalized film thickness of about 4% are produced with grooves provided in LiNbO$_3$ substrates with Euler angles (0°, θ, 0°), and SiO$_2$ layers with various film thickness are formed on the substrates.

FIG. 23 shows a relationship among the electromechanical coefficient $K_R^2$ of Rayleigh waves and the Euler angle θ and the normalized film thickness of the SiO$_2$ film and FIG. 24 shows a relationship among the electromechanical coefficient $K_{SH}^2$ of SH waves and the Euler angle θ and the normalized film thickness of the SiO$_2$ film when the IDT electrodes made of Au have a normalized film thickness of about 4%.

As shown in FIGS. 17 to 24, as long as the Au films have a normalized film thickness in the range of about 2% to about 4% and the SiO$_2$ films have a normalized film thickness in the range of about 20% to about 40%, the electromechanical coefficient $K_R^2$ of Rayleigh waves has a maximum value at an Euler angle θ in the range of about 208° to about 228° irrespective of film thickness. Furthermore, the electromechanical coefficient $K_R^2$ tends to decrease as the Euler angle θ decreases, and the electromechanical coefficient $K_R^2$ also tends to decrease as the Euler angle θ increases from the angle corresponding to the maximum value.

In contrast, the electromechanical coefficient $K_{SH}^2$ of SH waves, which cause spurious responses, have a minimum value in the range in which the Euler angle θ is about 200° to about 230°.

The results in FIGS. 17 to 24 show that combinations shown in Table 11 below provide an Euler angle θ at which the main response caused by Rayleigh waves has an electromechanical coefficient $K_R^2$ of at least about 0.08, which provides a sufficient response, and SH waves, which cause spurious responses, have an electromechanical coefficient $K_{SH}^2$ of less than about 0.02. Thus, to achieve the main response caused by Rayleigh waves having an electromechanical coefficient $K_R^2$ of at least about 0.08 and SH waves, which cause spurious responses, having an electromechanical coefficient $K_{SH}^2$ of less than about 0.02, the Euler angle θ should be selected in accordance with Table 11 below.

Surface acoustic wave resonators or surface acoustic wave filters in which the main response caused by Rayleigh waves has an electromechanical coefficient $K_R^2$ of at least about 0.08 have good resonance characteristics and filter characteristics. In this case, when SH waves have an electromechanical coefficient $K_{SH}^2$ of about 0.02 or more, spurious responses caused by the SH waves are no longer negligible and degrade resonance characteristics and/or filter characteristics.

Thus, as shown in Table 11, by selecting a normalized film thickness (%) range of the IDT electrode made of Au, a normalized film thickness (%) range of the SiO$_2$ film, and an Euler angle θ (°) range in the rightmost column in Table 11, the main response caused by Rayleigh waves that are used have an electromechanical coefficient of at least about 0.08, which provides a sufficient response. Moreover, SH waves, which cause spurious responses, have an electromechanical coefficient of less than about 0.02, to thereby effectively suppress influences caused by spurious responses.

As show in FIGS. 17 to 24 and Table 11, when the Euler angle θ is in the range of about 208° to about 225°, Rayleigh waves that are used may have a sufficiently high electromechanical coefficient $K_R^2$ while SH waves may have a relatively low electromechanical coefficient $K_{SH}^2$ by appropriately selecting the normalized film thickness of the IDT electrode and the normalized film thickness of the SiO$_2$, thereby effectively suppressing spurious responses caused by the SH waves.

TABLE 11

| *Film thickness of IDT electrode | Thickness of SiO$_2$ film | Cut angle achieving $K_R^2 > 0.08$ | Cut angle achieving $K_{SH}^2 < 0.02$ | $K_R^2 > 0.08$ and $K_{SH}^2 < 0.02$ |
|---|---|---|---|---|
| 1.5% < h/λ ≦ 2.5% | 17.5% < h/λ ≦ 22.5% | 208~224 | 207~224 | 208~224 |
| | 22.5% < h/λ ≦ 27.5% | 208~228 | 208~222 | 208~222 |
| | 27.5% < h/λ ≦ 32.5% | 208~228 | 207~224 | 208~224 |
| | 32.5% < h/λ ≦ 37.5% | 210~226 | 205~225 | 210~225 |
| | 37.5% < h/λ ≦ 42.5% | **No range | 203~227 | **No range |
| 2.5% < h/λ ≦ 3.25% | 17.5% < h/λ ≦ 22.5% | 208~228 | 209~221 | 209~221 |
| | 22.5% < h/λ ≦ 27.5% | 209~227 | 209~221 | 209~221 |
| | 27.5% < h/λ ≦ 32.5% | 209~227 | 208~223 | 209~223 |
| | 32.5% < h/λ ≦ 37.5% | 209~226 | 207~224 | 210~225 |
| | 37.5% < h/λ ≦ 42.5% | 212~224 | 204~226 | 212~224 |

TABLE 11-continued

| *Film thickness of IDT electrode | Thickness of SiO₂ film | Cut angle achieving $K_R^2 > 0.08$ | Cut angle achieving $K_{SH}^2 < 0.02$ | $K_R^2 > 0.08$ and $K_{SH}^2 < 0.02$ |
|---|---|---|---|---|
| 3.25% < h/λ ≦ 3.75% | 17.5% < h/λ ≦ 22.5% | 210~226 | ***No range | ***No range |
| | 22.5% < h/λ ≦ 27.5% | 212~224 | ***No range | ***No range |
| | 27.5% < h/λ ≦ 32.5% | 212~224 | ***No range | ***No range |
| | 32.5% < h/λ ≦ 37.5% | 211~225 | 210~222 | 210~225 |
| | 37.5% < h/λ ≦ 42.5% | 212~224 | 206~225 | 212~224 |

*Film thickness of IDT electrode (primarily containing Au)
**No range achieving $K_R^2 > 0.08$
***No range achieving $K_{SH}^2 < 0.02$ Referring to Table 12 below, SH waves, which cause spurious responses, more preferably have an electromechanical coefficient $K_{SH}^2$ of less than about 0.01 by selecting the Euler angle θ from the range of about 210° to about 225° and selecting the Euler angle θ, the normalized film thickness (%) of the SiO₂, and the normalized film thickness (%) of the IDT electrode from the ranges shown in Table 12.

$K_{SH}^2$ of SH waves, which cause spurious responses, is in the range of less than about 0.02 when the Euler angle θ is in the range of about 202° to about 228°, although the values depend on the thickness of the SiO₂ film.

Figure 27:
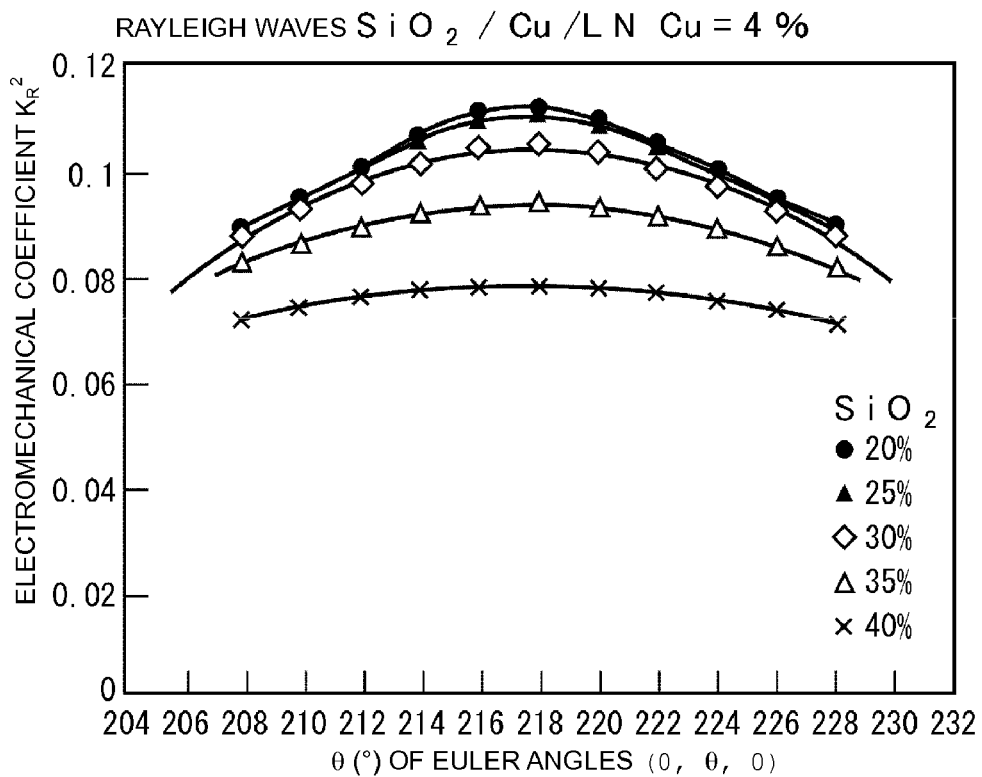
FIG. 27 is a graph showing the electromechanical coefficient $K_R^2$ of Rayleigh waves as a function of the Euler angle θ when IDT electrodes that are made of Cu and have a normalized film thickness of about 4% are produced with grooves provided in LiNbO$_3$ substrates with Euler angles (0°, θ, 0°), and SiO$_2$ layers with various film thickness are formed on the substrates.
Figure 28:
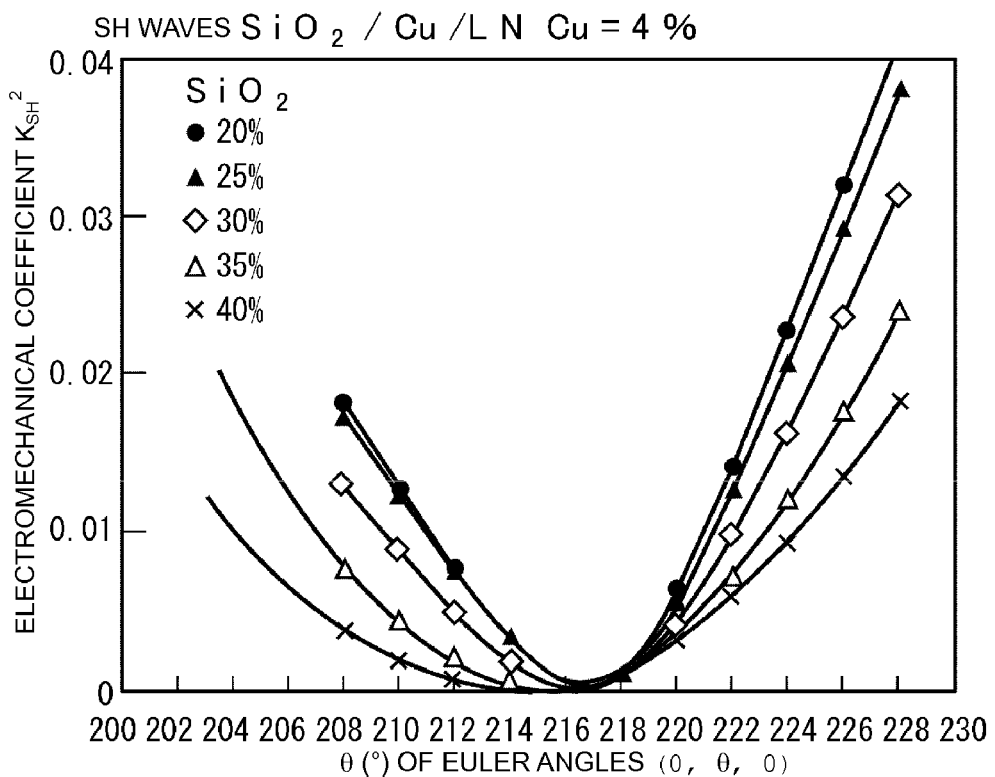
FIG. 28 is a graph showing the electromechanical coefficient $K_{SH}^2$ of SH waves as a function of the Euler angle θ when IDT electrodes that are made of Cu and have a normalized film thickness of about 4% are produced with grooves provided in LiNbO$_3$ substrates with Euler angles (0°, θ, 0°), and SiO$_2$ layers with various film thickness are formed on the substrates.

FIG. 27 shows a relationship among the electromechanical coefficient $K_R^2$ of Rayleigh waves and the Euler angle θ and the normalized film thickness of the SiO₂ film and FIG. 28

TABLE 12

| *Film thickness of IDT electrode | Thickness of SiO₂ film | Cut angle achieving $K_R^2 > 0.08$ | Cut angle achieving $K_{SH}^2 < 0.01$ | $K_R^2 > 0.08$ and $K_{SH}^2 < 0.01$ |
|---|---|---|---|---|
| 1.5% < h/λ ≦ 2.5% | 17.5% < h/λ ≦ 22.5% | 208~228 | 210~224 | 210~224 |
| | 22.5% < h/λ ≦ 27.5% | 208~228 | 211~222 | 211~222 |
| | 27.5% < h/λ ≦ 32.5% | 208~228 | 210~224 | 210~224 |
| | 32.5% < h/λ ≦ 37.5% | 210~226 | 208~225 | 210~225 |
| | 37.5% < h/λ ≦ 42.5% | **No range | 206~227 | **No range |
| 2.5% < h/λ ≦ 3.25% | 17.5% < h/λ ≦ 22.5% | 208~228 | 214~221 | 214~221 |
| | 22.5% < h/λ ≦ 27.5% | 209~227 | ***No range | ***No range |
| | 27.5% < h/λ ≦ 32.5% | 209~227 | 214~218 | 214~228 |
| | 32.5% < h/λ ≦ 37.5% | 209~226 | 210~222 | 210~225 |
| | 37.5% < h/λ ≦ 42.5% | 212~224 | 208~223 | 212~223 |
| 3.25% < h/λ ≦ 3.75% | 17.5% < h/λ ≦ 22.5% | 210~226 | ***No range | ***No range |
| | 22.5% < h/λ ≦ 27.5% | 212~224 | ***No range | ***No range |
| | 27.5% < h/λ ≦ 32.5% | 212~224 | ***No range | ***No range |
| | 32.5% < h/λ ≦ 37.5% | 211~225 | ***No range | ***No range |
| | 37.5% < h/λ ≦ 42.5% | 212~224 | 208~222 | 212~222 |

*Film thickness of IDT electrode (primarily containing Au)
**No range achieving $K_R^2 > 0.08$
***No range achieving $K_{SH}^2 < 0.01$ Multiple surface acoustic wave devices were manufactured in which Y-cut X-propagation LiNbO₃ substrates with various Euler angles were used, Cu was used to form electrodes, the normalized film thickness h/λ (%) of the electrodes was changed in the range of about 2% to about 8%, and the normalized film thickness h/λ of the SiO₂ layers was changed in the range of about 20% to about 40%. The electromechanical coefficient $K_R^2$ of Rayleigh waves and the electromechanical coefficient $K_{SH}^2$ of SH waves, which cause spurious responses against the main response of the Rayleigh waves, were measured for the surface acoustic wave devices. The results are shown in FIGS. 25 to 32.

Figure 25:
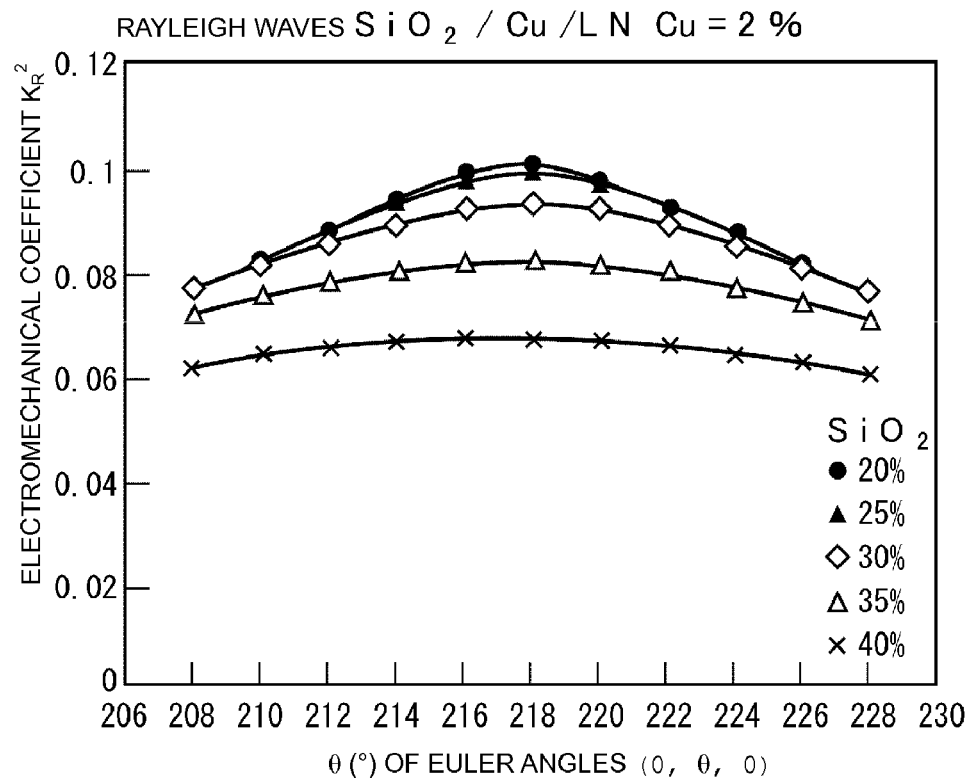
FIG. 25 is a graph showing the electromechanical coefficient $K_R^2$ of Rayleigh waves as a function of the Euler angle θ when IDT electrodes that are made of Cu and have a normalized film thickness of about 2% are produced with grooves provided in LiNbO$_3$ substrates with Euler angles (0°, θ, 0°), and SiO$_2$ layers with various film thickness are formed on the substrates.
Figure 26:
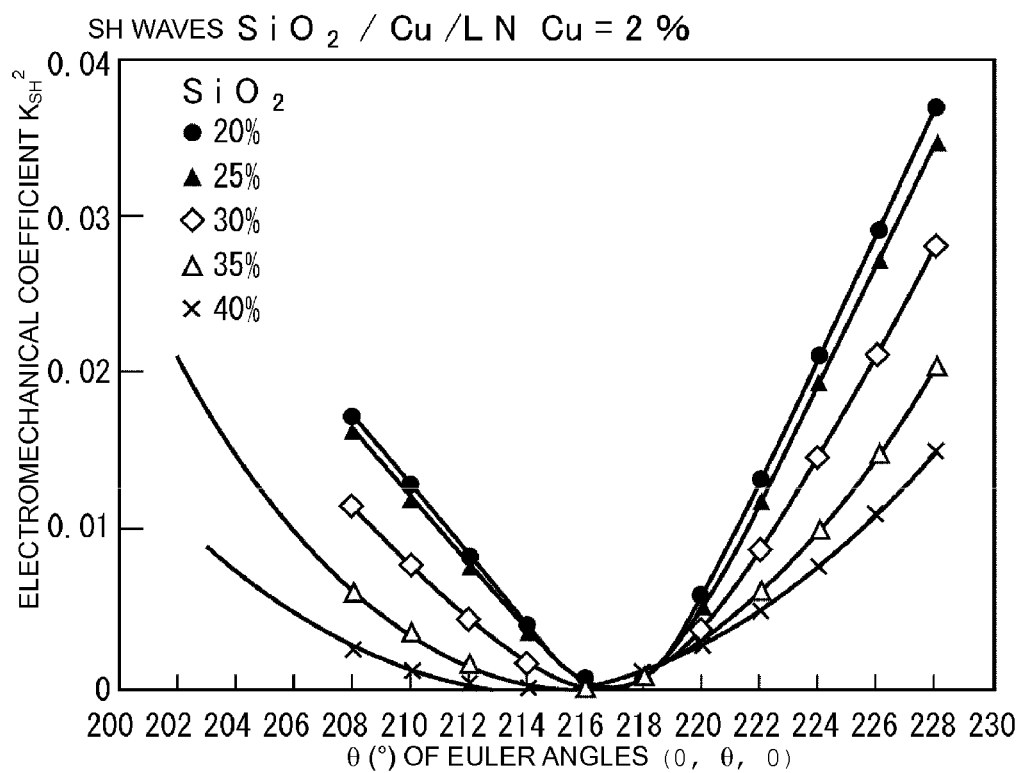
FIG. 26 is a graph showing the electromechanical coefficient $K_{SH}^2$ of SH waves as a function of the Euler angle θ when IDT electrodes that are made of Cu and have a normalized film thickness of about 2% are produced with grooves provided in LiNbO$_3$ substrates with Euler angles (0°, θ, 0°), and SiO$_2$ layers with various film thickness are formed on the substrates.

FIG. 25 shows the electromechanical coefficient $K_R^2$ of Rayleigh waves and FIG. 26 shows the electromechanical coefficient $K_{SH}^2$ of SH waves when the IDT electrodes made of Cu have a normalized film thickness (%) of about 2%.

FIGS. 25 and 26 clearly show the following finding when the IDT electrodes made of Cu have a normalized film thickness of about 2%. The electromechanical coefficient $K_R^2$ of the main response caused by Rayleigh waves is in the range of at least about 0.08 when the Euler angle θ is in the range of about 208° to about 228°, although the values depend on the thickness of the SiO₂ film. The electromechanical coefficient shows a relationship among the electromechanical coefficient $K_{SH}^2$ of SH waves and the Euler angle θ and the normalized film thickness of the SiO₂ film when the IDT electrodes made of Cu have a normalized film thickness H/λ of about 4%.

Figure 29:
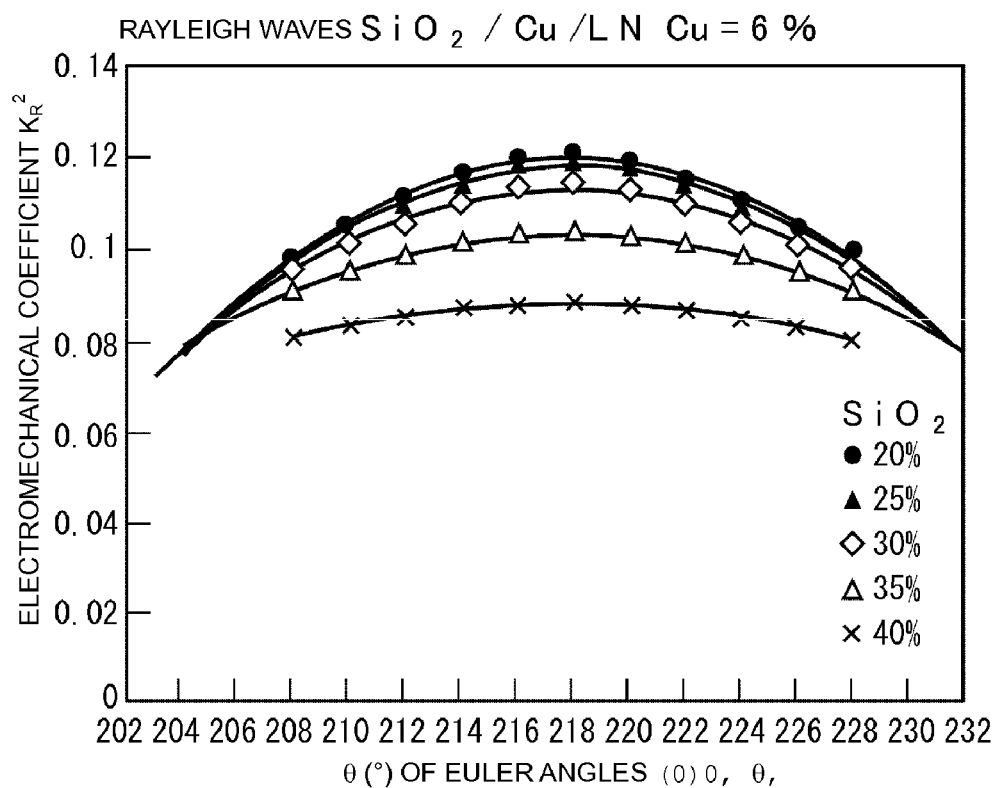
FIG. 29 is a graph showing the electromechanical coefficient $K_R^2$ of Rayleigh waves as a function of the Euler angle θ when IDT electrodes that are made of Cu and have a normalized film thickness of about 6% are produced with grooves provided in LiNbO$_3$ substrates with Euler angles (0°, θ, 0°), and SiO$_2$ layers with various film thickness are formed on the substrates.
Figure 30:
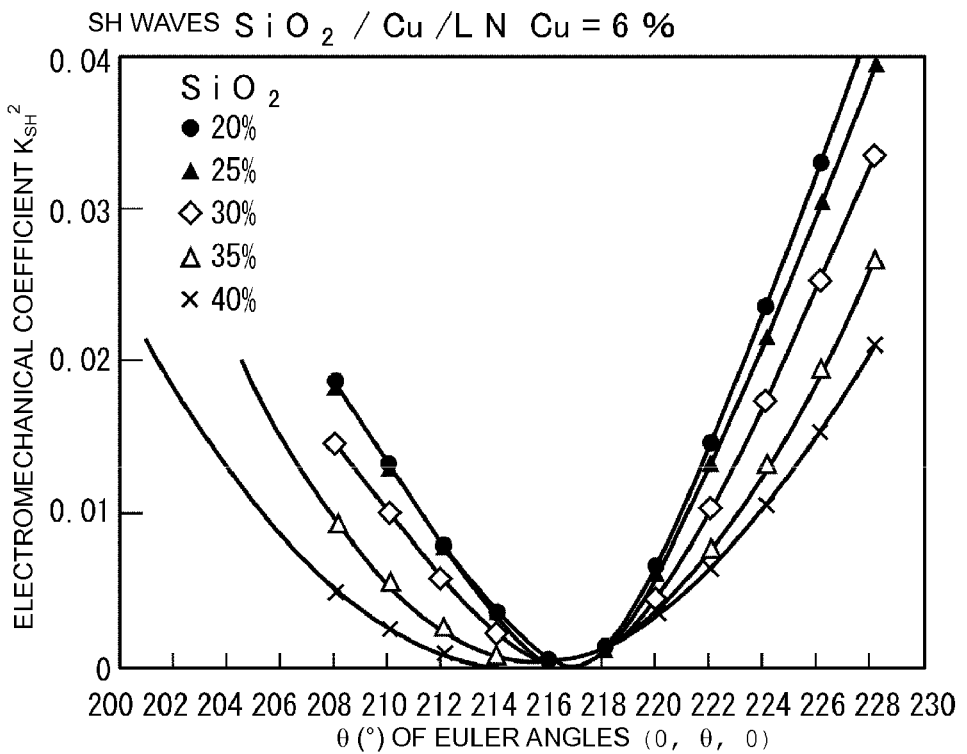
FIG. 30 is a graph showing the electromechanical coefficient $K_{SH}^2$ of SH waves as a function of the Euler angle θ when IDT electrodes that are made of Cu and have a normalized film thickness of about 6% are produced with grooves provided in LiNbO$_3$ substrates with Euler angles (0°, θ, 0°), and SiO$_2$ layers with various film thickness are formed on the substrates.

FIG. 29 shows a relationship among the electromechanical coefficient $K_R^2$ of Rayleigh waves and the Euler angle θ and the normalized film thickness of the SiO₂ film and FIG. 30 shows a relationship among the electromechanical coefficient $K_{SH}^2$ of SH waves and the Euler angle θ and the normalized film thickness of the SiO₂ film when the IDT electrodes made of Cu have a normalized film thickness of about 6%.

Figure 31:
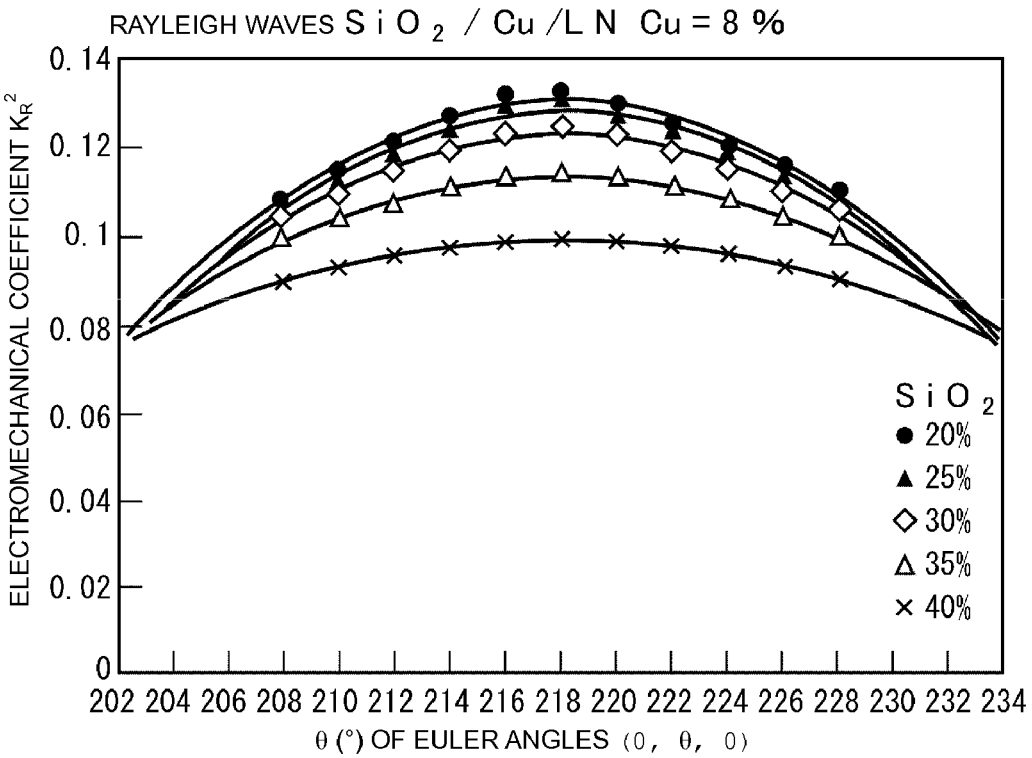
FIG. 31 is a graph showing the electromechanical coefficient $K_R^2$ of Rayleigh waves as a function of the Euler angle θ when IDT electrodes that are made of Cu and have a normalized film thickness of about 8% are produced with grooves provided in LiNbO$_3$ substrates with Euler angles (0°, θ, 0°), and SiO$_2$ layers with various film thickness are formed on the substrates.
Figure 32:
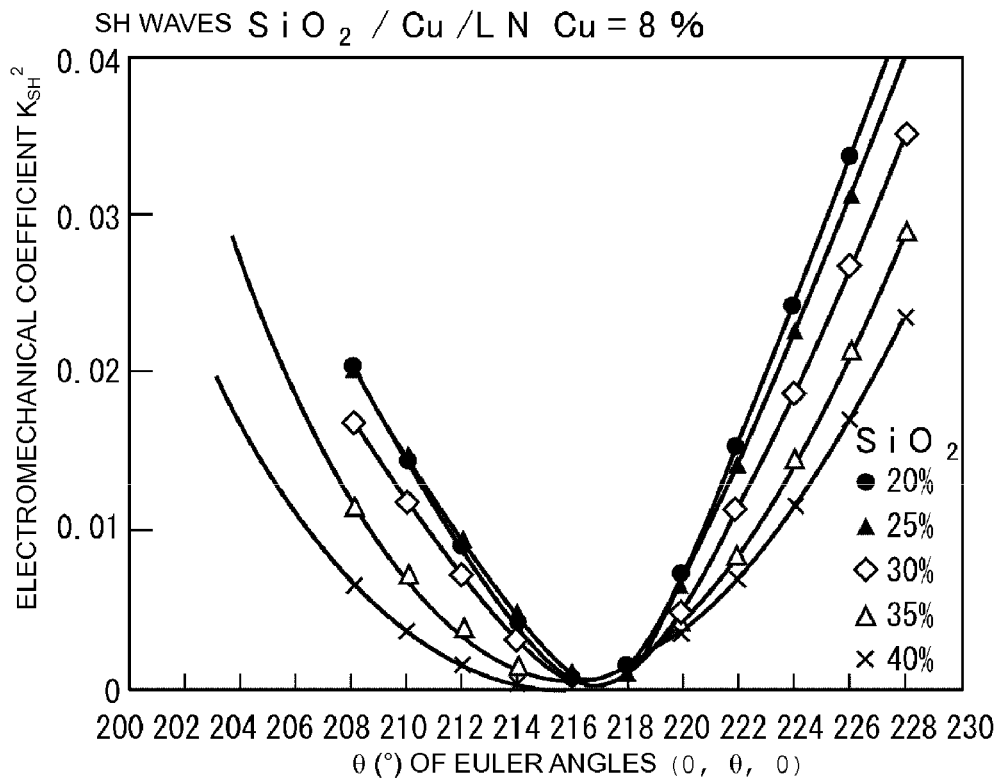
FIG. 32 is a graph showing the electromechanical coefficient $K_{SH}^2$ of SH waves as a function of the Euler angle θ when IDT electrodes that are made of Cu and have a normalized film thickness of about 8% are produced with grooves provided in substrates with Euler angles (0°, θ, 0°), and SiO$_2$ layers with various film thickness are formed on the substrates.

FIG. 31 shows a relationship among the electromechanical coefficient $K_R^2$ of Rayleigh waves and the Euler angle θ and the normalized film thickness of the SiO₂ film and FIG. 32 shows a relationship among the electromechanical coefficient $K_{SH}^2$ of SH waves and the Euler angle θ and the normalized film thickness of the SiO₂ film when the IDT electrodes made of Cu have a normalized film thickness of about 8%.

As shown in FIGS. 25 to 32, as long as the Cu films have a normalized film thickness in the range of about 2% to about 8% and the SiO₂ films have a normalized film thickness in the range of about 20% to about 40%, the electromechanical coefficient $K_R^2$ of Rayleigh waves has a maximum value at an Euler angle θ in the range of about 208° to about 228° irrespective of film thickness, the electromechanical coefficient $K_R^2$ tends to decrease as the Euler angle θ decreases, and the electromechanical coefficient $K_R^2$ also tends to decrease as the Euler angle θ increases from the angle corresponding to the maximum value.

In contrast, the electromechanical coefficient $K_{SH}^2$ of SH waves, which cause spurious responses, have a minimum value in the range in which the Euler angle θ is about 202° to about 228°.

The results in FIGS. 25 to 32 show that combinations indicated in Table 13 below give an Euler angle θ at which the main response caused by Rayleigh waves has an electromechanical coefficient $K_R^2$ of at least about 0.08, which provides a sufficient response, and SH waves, which cause spurious responses, have an electromechanical coefficient $K_{SH}^2$ of less than about 0.02. Thus, to achieve the main response caused by Rayleigh waves having an electromechanical coefficient $K_R^2$ of at least about 0.08 and SH waves, which cause spurious responses, having an electromechanical coefficient $K_{SH}^2$ of less than about 0.02, the Euler angle θ should be selected in accordance with Table 13 below.

by the SH waves are no longer negligible and degrade resonance characteristics or filter characteristics.

Thus, as shown in Table 13, by selecting a normalized film thickness (%) range of the IDT electrode made of Cu, a normalized film thickness (%) range of the $SiO_2$ film, and an Euler angle θ (°) range in the rightmost column in Table 13, the main response caused by Rayleigh waves that are used has an electromechanical coefficient of at least about 0.08, which provides a sufficient response. Moreover, SH waves, which cause spurious responses, have an electromechanical coefficient of less than about 0.02, thereby effectively suppressing influences caused by spurious responses.

As shown in FIGS. 25 to 32 and Table 13, when the Euler angle θ is in the range of about 204° to about 228°, Rayleigh waves that are used have a sufficiently high electromechanical coefficient $K_R^2$ while SH waves have a relatively low electromechanical coefficient $K_{SH}^2$ are provided by appropriately selecting the normalized film thickness of the IDT electrode and the normalized film thickness of the $SiO_2$, thereby effectively suppressing spurious responses caused by the SH waves.

TABLE 13

| *Film thickness of IDT electrode | Thickness of $SiO_2$ film | Cut angle achieving $K_R^2 > 0.08$ | Cut angle achieving $K_{SH}^2 < 0.02$ | $K_R^2 > 0.08$ and $K_{SH}^2 < 0.02$ |
|---|---|---|---|---|
| 1% < h/λ ≦ 3% | 17.5% < h/λ ≦ 22.5% | 209~227 | 207~225 | 209~225 |
|  | 22.5% < h/λ ≦ 27.5% | 209~227 | 207~225 | 209~225 |
|  | 27.5% < h/λ ≦ 32.5% | 209~227 | 203~226 | 209~226 |
|  | 32.5% < h/λ ≦ 37.5% | 214~222 | 202~228 | 214~222 |
|  | 37.5% < h/λ ≦ 42.5% | **No range | ***No range | ****No range |
| 3% < h/λ ≦ 5% | 17.5% < h/λ ≦ 22.5% | 206~230 | 207~224 | 207~224 |
|  | 22.5% < h/λ ≦ 27.5% | 206~230 | 207~225 | 207~225 |
|  | 27.5% < h/λ ≦ 32.5% | 206~230 | 206~226 | 206~226 |
|  | 32.5% < h/λ ≦ 37.5% | 207~229 | 201~227 | 207~227 |
|  | 37.5% < h/λ ≦ 42.5% | **No range | ***No range | ****No range |
| 5% < h/λ ≦ 7% | 17.5% < h/λ ≦ 22.5% | 202~232 | 207~224 | 207~224 |
|  | 22.5% < h/λ ≦ 27.5% | 202~232 | 208~225 | 208~225 |
|  | 27.5% < h/λ ≦ 32.5% | 202~232 | 206~226 | 206~226 |
|  | 32.5% < h/λ ≦ 37.5% | 202~232 | 204~227 | 204~227 |
|  | 37.5% < h/λ ≦ 42.5% | 204~228 | 200~228 | 204~228 |
| 7% < h/λ ≦ 9% | 17.5% < h/λ ≦ 22.5% | 202~234 | 208~224 | 208~224 |
|  | 22.5% < h/λ ≦ 27.5% | 202~234 | 208~224 | 208~224 |
|  | 27.5% < h/λ ≦ 32.5% | 202~234 | 207~225 | 207~225 |
|  | 32.5% < h/λ ≦ 37.5% | 202~233 | 205~226 | 205~226 |
|  | 37.5% < h/λ ≦ 42.5% | 204~232 | 202~228 | 204~228 |

*Film thickness of IDT electrode (primarily containing Cu)
**No range achieving $K_R^2 > 0.08$
***No range achieving $K_{SH}^2 < 0.02$
****No range achieving $K_R^2 > 0.08$ and $K_{SH}^2 < 0.02$ Surface acoustic wave resonators or surface acoustic wave filters in which the main response caused by Rayleigh waves has an electromechanical coefficient $K_R^2$ of at least about 0.08 have good resonance characteristics and filter characteristics. In this case, when SH waves have an electromechanical coefficient $K_{SH}^2$ of about 0.02 or more, spurious responses caused Referring to Table 14 below, SH waves, which cause spurious responses, more preferably have an electromechanical coefficient $K_{SH}^2$ of less than about 0.01 by selecting the Euler angle θ from the range of about 204° to about 226° and selecting the Euler angle θ, the normalized film thickness (%) of the $SiO_2$, and the normalized film thickness (%) of the IDT electrode from the ranges shown in Table 14.

TABLE 14

| *Film thickness of IDT electrode | Thickness of $SiO_2$ film | Cut angle achieving $K_R^2 > 0.08$ | Cut angle achieving $K_{SH}^2 < 0.01$ | $K_R^2 > 0.08$ and $K_{SH}^2 < 0.01$ |
|---|---|---|---|---|
| 1% < h/λ ≦ 3% | 17.5% < h/λ ≦ 22.5% | 209~227 | 210~222 | 210~222 |
|  | 22.5% < h/λ ≦ 27.5% | 209~227 | 210~222 | 210~222 |
|  | 27.5% < h/λ ≦ 32.5% | 209~227 | 208~222 | 209~222 |
|  | 32.5% < h/λ ≦ 37.5% | 214~222 | 206~224 | 214~222 |
|  | 37.5% < h/λ ≦ 42.5% | **No range | 202~226 | **No range |

TABLE 14-continued

| *Film thickness of IDT electrode | Thickness of SiO$_2$ film | Cut angle achieving K$_R^2$ > 0.08 | Cut angle achieving K$_{SH}^2$ < 0.01 | K$_R^2$ > 0.08 and K$_{SH}^2$ < 0.01 |
|---|---|---|---|---|
| 3% < h/λ ≦ 5% | 17.5% < h/λ ≦ 22.5% | 206~230 | 210~222 | 210~222 |
| | 22.5% < h/λ ≦ 27.5% | 206~230 | 210~222 | 210~222 |
| | 27.5% < h/λ ≦ 32.5% | 206~230 | 207~226 | 207~226 |
| | 32.5% < h/λ ≦ 37.5% | 207~229 | 206~224 | 207~224 |
| | 37.5% < h/λ ≦ 42.5% | **No range | 204~224 | **No range |
| 5% < h/λ ≦ 7% | 17.5% < h/λ ≦ 22.5% | 202~232 | 210~222 | 210~222 |
| | 22.5% < h/λ ≦ 27.5% | 202~232 | 210~222 | 210~222 |
| | 27.5% < h/λ ≦ 32.5% | 202~232 | 207~222 | 207~222 |
| | 32.5% < h/λ ≦ 37.5% | 202~232 | 208~224 | 208~224 |
| | 37.5% < h/λ ≦ 42.5% | 204~228 | 204~225 | 204~225 |
| 7% < h/λ ≦ 9% | 17.5% < h/λ ≦ 22.5% | 202~234 | 210~221 | 210~221 |
| | 22.5% < h/λ ≦ 27.5% | 202~234 | 210~221 | 210~221 |
| | 27.5% < h/λ ≦ 32.5% | 202~234 | 210~222 | 210~222 |
| | 32.5% < h/λ ≦ 37.5% | 202~233 | 208~223 | 208~223 |
| | 37.5% < h/λ ≦ 42.5% | 204~232 | 206~224 | 206~224 |

*Film thickness of IDT electrode (primarily containing Cu)
**No range achieving K$_R^2$ > 0.08

Multiple surface acoustic wave devices were manufactured in which Y-cut X-propagation LiNbO$_3$ substrates with various Euler angles were used, Ta was used to form electrodes, the normalized film thickness h/λ (%) of the electrodes was changed in the range of about 2% to about 5%, and the normalized film thickness h/λ of the SiO$_2$ layers was changed in the range of about 20% to about 35%. The electromechanical coefficient K$_R^2$ of Rayleigh waves and the electromechanical coefficient K$_{SH}^2$ of SH waves, which cause spurious responses against the main response of the Rayleigh waves, were measured for the surface acoustic wave devices. The results are shown in FIGS. 33 to 40.

Figure 33:
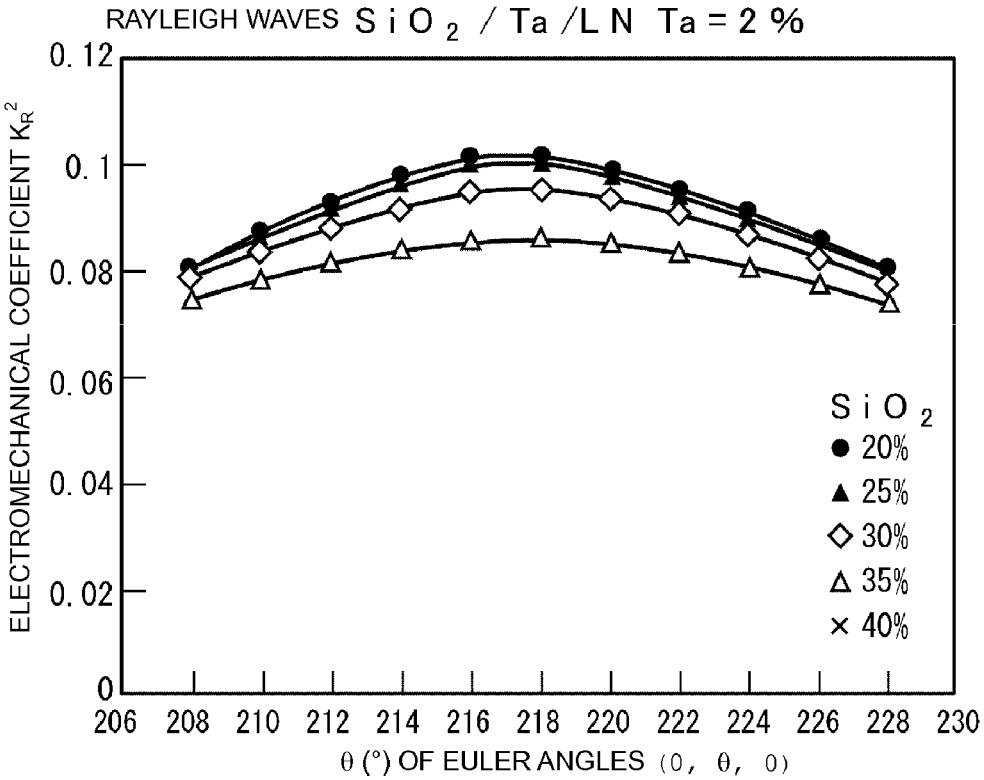
FIG. 33 is a graph showing the electromechanical coefficient $K_R^2$ of Rayleigh waves as a function of the Euler angle θ when IDT electrodes that are made of Ta and have a normalized film thickness of about 2% are produced with grooves provided in LiNbO$_3$ substrates with Euler angles (0°, θ, 0°), and SiO$_2$ layers with various film thickness are formed on the substrates.
Figure 34:
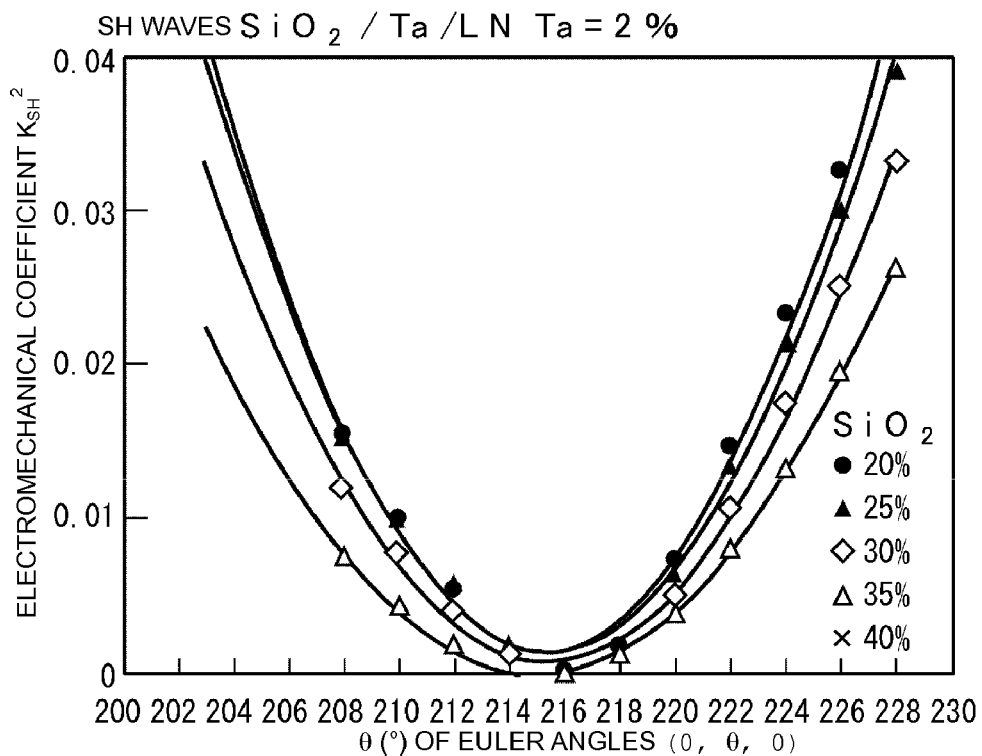
FIG. 34 is a graph showing the electromechanical coefficient $K_{SH}^2$ of SH waves as a function of the Euler angle θ when IDT electrodes that are made of Ta and have a normalized film thickness of about 2% are produced with grooves provided in LiNbO$_3$ substrates with Euler angles (0°, θ, 0°), and SiO$_2$ layers with various film thickness are formed on the substrates.

FIG. 33 shows the electromechanical coefficient K$_R^2$ of Rayleigh waves and FIG. 34 shows the electromechanical coefficient K$_{SH}^2$ of SH waves when the IDT electrodes made of Ta have a normalized film thickness (%) of about 2%.

FIGS. 33 and 34 clearly show the following finding when the IDT electrodes made of Ta have a normalized film thickness of about 2%. The electromechanical coefficient K$_R^2$ of the main response caused by Rayleigh waves is in the range of at least about 0.08 when the Euler angle θ is in the range of about 208° to about 228°, although the values depend on the thickness of the SiO$_2$ film. The electromechanical coefficient K$_{SH}^2$ of SH waves, which cause spurious responses, is in the range of less than about 0.02 when the Euler angle θ is in the range of about 204° to about 226°, although the values depend on the thickness of the SiO$_2$ film.

Figure 35:
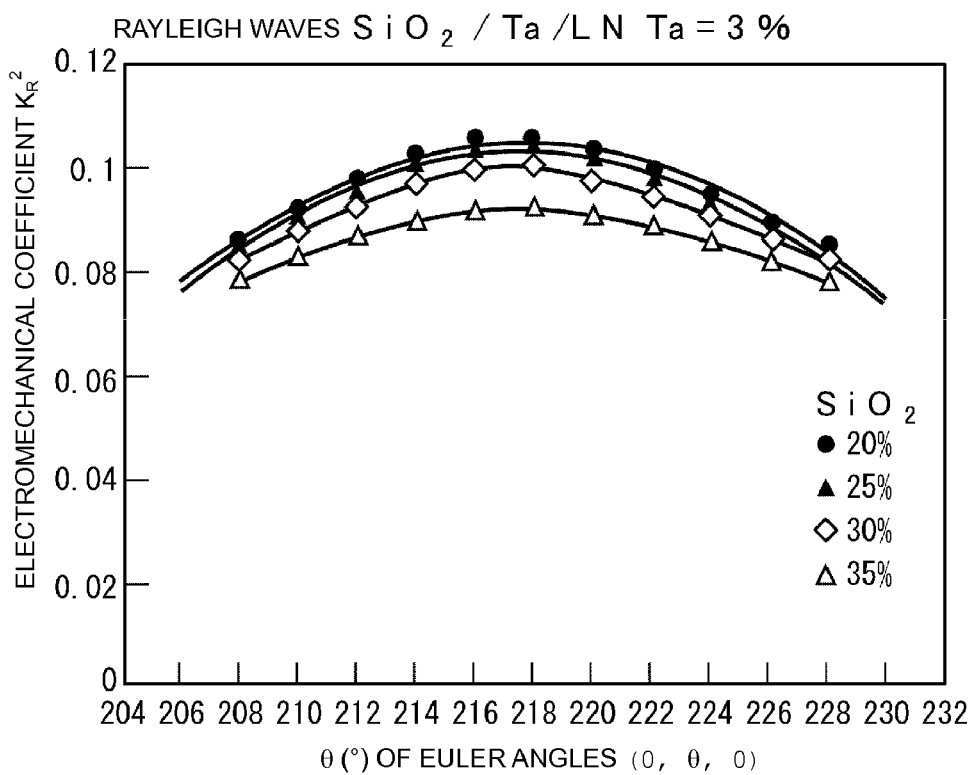
FIG. 35 is a graph showing the electromechanical coefficient $K_R^2$ of Rayleigh waves as a function of the Euler angle θ when IDT electrodes that are made of Ta and have a normalized film thickness of about 3% are produced with grooves provided in LiNbO$_3$ substrates with Euler angles (0°, θ, 0°), and SiO$_2$ layers with various film thickness are formed on the substrates.
Figure 36:
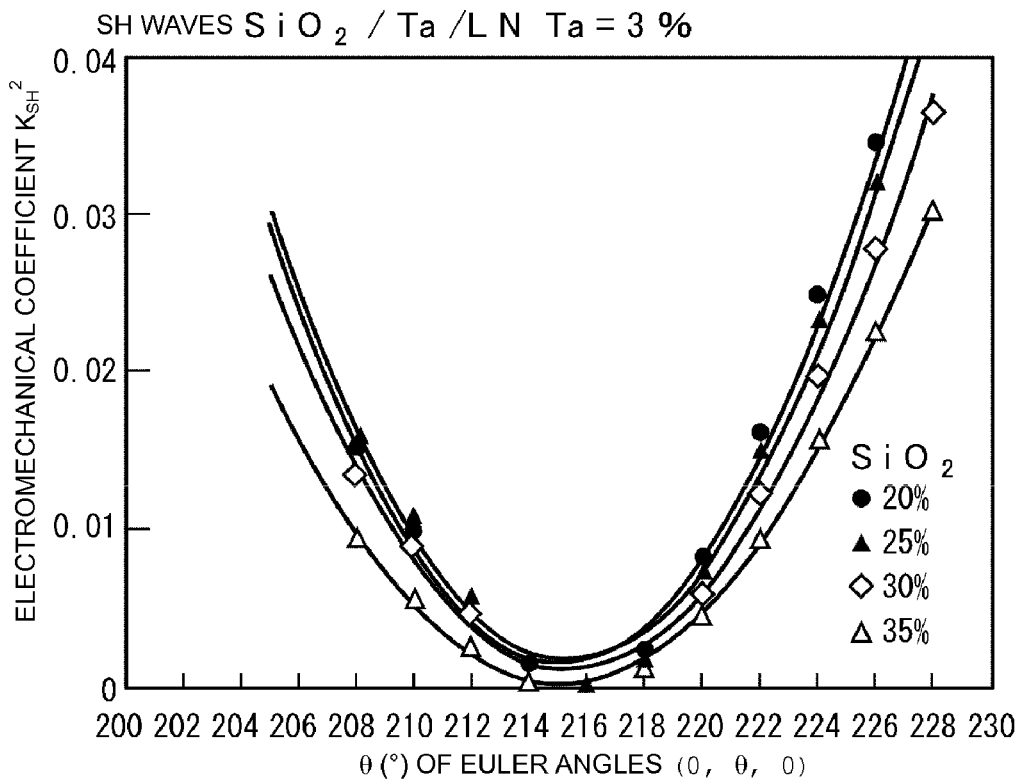
FIG. 36 is a graph showing the electromechanical coefficient $K_{SH}^2$ of SH waves as a function of the Euler angle θ when IDT electrodes that are made of Ta and have a normalized film thickness of about 3% are produced with grooves provided in LiNbO$_3$ substrates with Euler angles (0°, θ, 0°), and SiO$_2$ layers with various film thickness are formed on the substrates.

FIG. 35 shows a relationship among the electromechanical coefficient K$_R^2$ of Rayleigh waves and the Euler angle θ and the normalized film thickness of the SiO$_2$ film and FIG. 36 shows a relationship among the electromechanical coefficient K$_{SH}^2$ of SH waves and the Euler angle θ and the normalized film thickness of the SiO$_2$ film when the IDT electrodes made of Ta have a normalized film thickness H/λ of about 3%.

Figure 37:
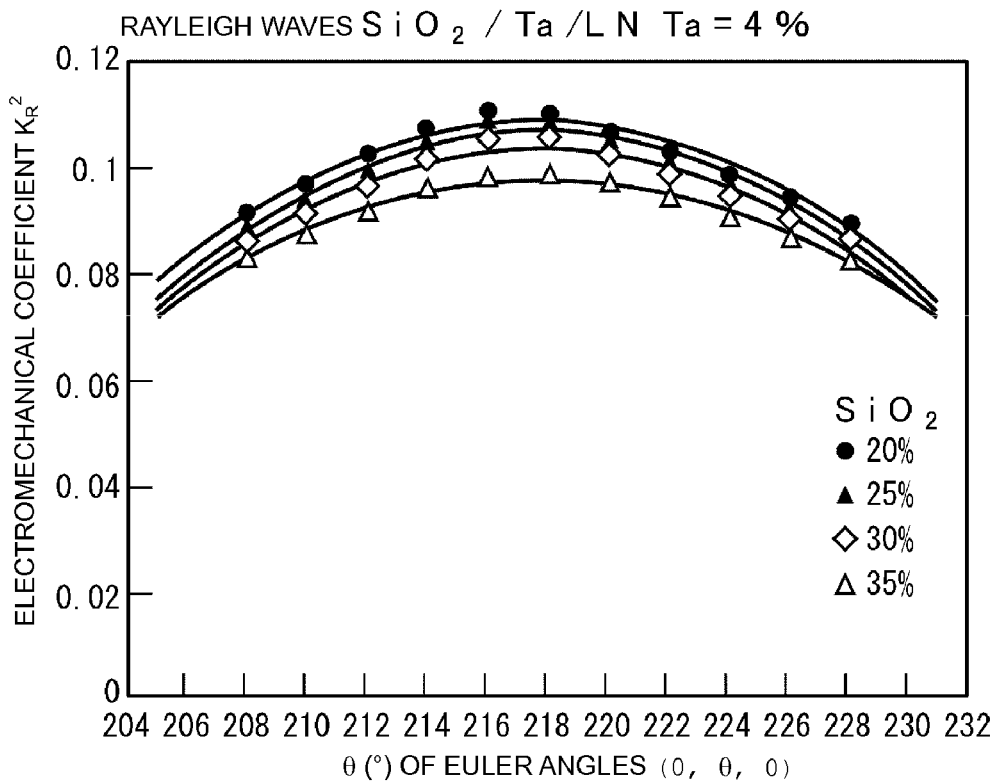
FIG. 37 is a graph showing the electromechanical coefficient $K_R^2$ of Rayleigh waves as a function of the Euler angle θ when IDT electrodes that are made of Ta and have a normalized film thickness of about 4% are produced with grooves provided in LiNbO$_3$ substrates with Euler angles (0°, θ, 0°), and SiO$_2$ layers with various film thickness are formed on the substrates.
Figure 38:
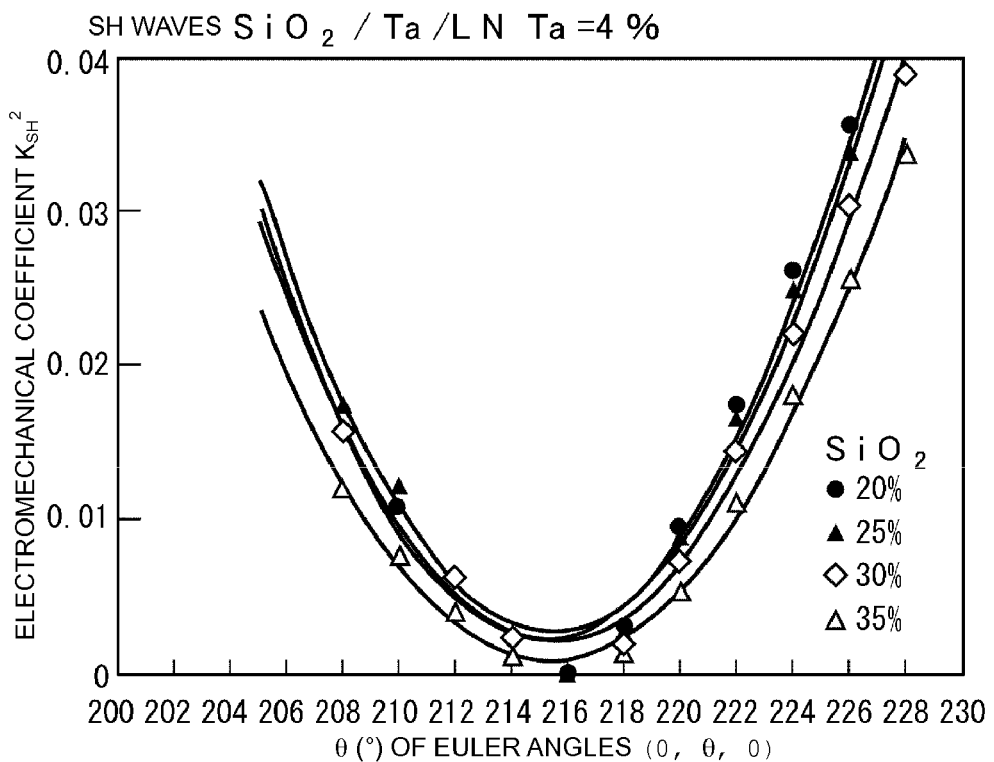
FIG. 38 is a graph showing the electromechanical coefficient $K_{SH}^2$ of SH waves as a function of the Euler angle θ when IDT electrodes that are made of Ta and have a normalized film thickness of about 4% are produced with grooves provided in LiNbO$_3$ substrates with Euler angles (0°, θ, 0°), and SiO$_2$ layers with various film thickness are formed on the substrates.

FIG. 37 shows a relationship among the electromechanical coefficient K$_R^2$ of Rayleigh waves and the Euler angle θ and the normalized film thickness of the SiO$_2$ film and FIG. 38 shows a relationship among the electromechanical coefficient K$_{SH}^2$ of SH waves and the Euler angle θ and the normalized film thickness of the SiO$_2$ film when the IDT electrodes made of Ta have a normalized film thickness of about 4%.

Figure 39:
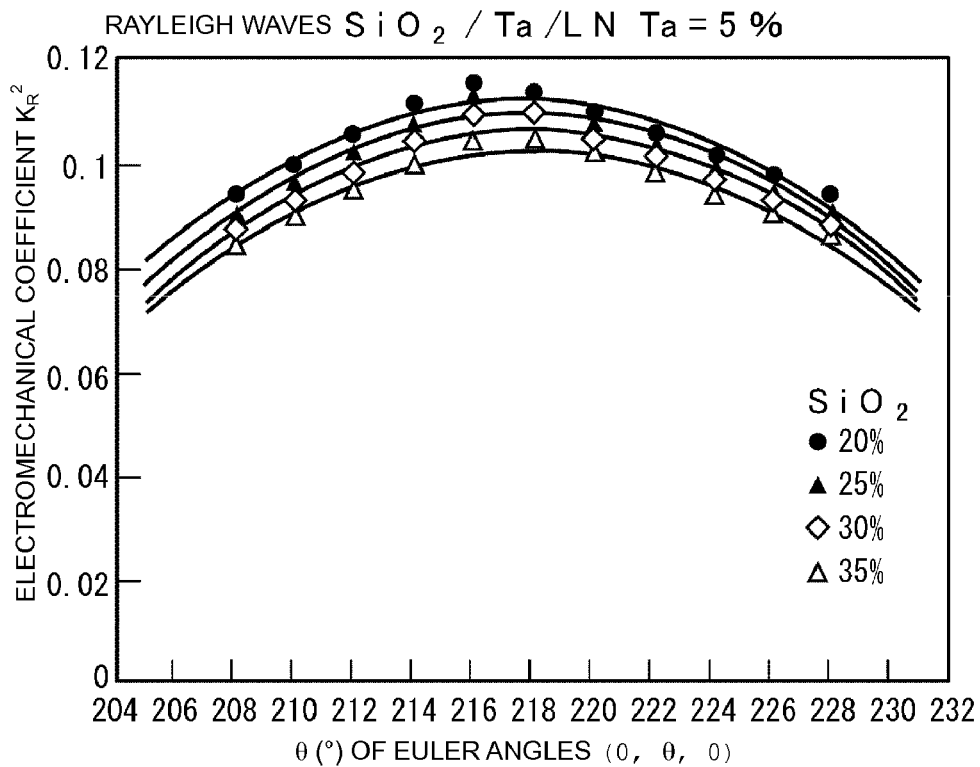
FIG. 39 is a graph showing the electromechanical coefficient $K_R^2$ of Rayleigh waves as a function of the Euler angle θ when IDT electrodes that are made of Ta and have a normalized film thickness of about 5% are produced with grooves provided in LiNbO$_3$ substrates with Euler angles (0°, θ, 0°), and SiO$_2$ layers with various film thickness are formed on the substrates.
Figure 40:
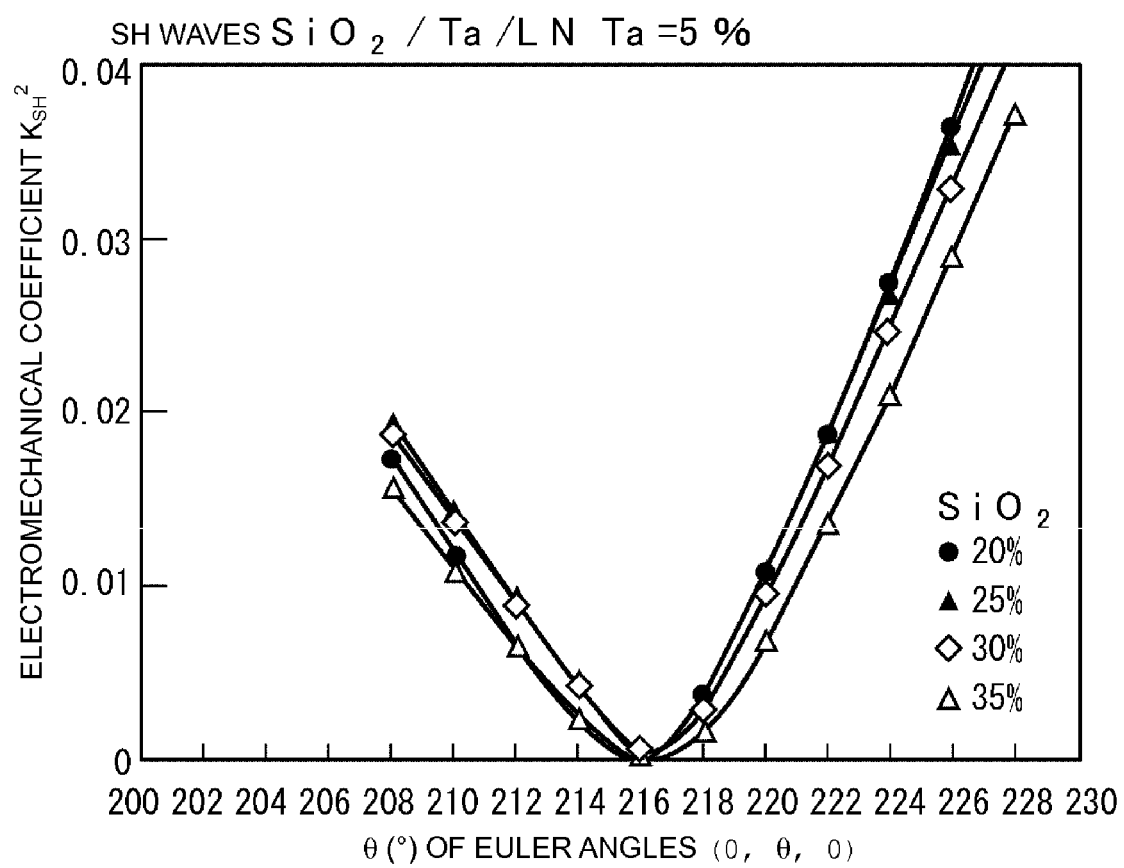
FIG. 40 is a graph showing the electromechanical coefficient $K_{SH}^2$ of SH waves as a function of the Euler angle θ when IDT electrodes that are made of Ta and have a normalized film thickness of about 5% are produced with grooves provided in LiNbO$_3$ substrates with Euler angles (0°, θ, 0°), and SiO$_2$ layers with various film thickness are formed on the substrates.

FIG. 39 shows a relationship among the electromechanical coefficient K$_R^2$ of Rayleigh waves and the Euler angle θ and the normalized film thickness of the SiO$_2$ film and FIG. 40 shows a relationship among the electromechanical coefficient K$_{SH}^2$ of SH waves and the Euler angle θ and the normalized film thickness of the SiO$_2$ film when the IDT electrodes made of Ta have a normalized film thickness of about 5%.

As shown in FIGS. 33 to 40, as long as the Ta films have a normalized film thickness in the range of about 2% to about 5% and the SiO$_2$ films have a normalized film thickness in the range of about 20% to about 35%, the electromechanical coefficient K$_R^2$ of Rayleigh waves has a maximum value at an Euler angle θ in the range of about 208° to about 228° irrespective of film thickness. Furthermore, the electromechanical coefficient K$_R^2$ tends to decrease as the Euler angle θ decreases, and the electromechanical coefficient K$_R^2$ also tends to decrease as the Euler angle θ increases from the angle corresponding to the maximum value.

In contrast, the electromechanical coefficient K$_{SH}^2$ of SH waves, which cause spurious responses, have a minimum value in the range in which the Euler angle θ is about 202° to about 228°.

The results in FIGS. 33 to 40 show that combinations indicated in Table 15 below provide an Euler angle θ at which the main response caused by Rayleigh waves has an electromechanical coefficient K$_R^2$ of at least about 0.08, which provides a sufficient response, and SH waves, which cause spurious responses, have an electromechanical coefficient K$_{SH}^2$ of less than about 0.02. Thus, to achieve the main response caused by Rayleigh waves having an electromechanical coefficient K$_R^2$ of at least about 0.08 and SH waves, which cause spurious responses, having an electromechanical coefficient K$_{SH}^2$ of less than about 0.02, the Euler angle θ should be selected in accordance with Table 15 below.

Surface acoustic wave resonators or surface acoustic wave filters in which the main response caused by Rayleigh waves has an electromechanical coefficient K$_R^2$ of at least about 0.08 have good resonance characteristics and filter characteristics. In this case, when SH waves have an electromechanical coefficient K$_{SH}^2$ of about 0.02 or more, spurious responses caused by the SH waves are no longer negligible and degrade resonance characteristics or filter characteristics.

Thus, as shown in Table 15, by selecting a normalized film thickness (%) range of the IDT electrode made of Ta, a normalized film thickness (%) range of the SiO$_2$ film, and an Euler angle θ (°) range in the rightmost column in Table 15, the main response caused by Rayleigh waves that are used has an electromechanical coefficient of at least about 0.08, providing a sufficient response, while SH waves, which cause spurious responses, have an electromechanical coefficient of less than about 0.02, thereby effectively suppressing influences caused by spurious responses.

As shown in FIGS. 33 to 40 and Table 15, when the Euler angle θ is in the range of about 206° to about 226°, Rayleigh waves that are used have a sufficiently high electromechanical coefficient $K_R^2$ while SH waves have a low electromechanical coefficient $K_{SH}^2$ by appropriately selecting the normalized film thickness of the IDT electrode and the normalized film thickness of the $SiO_2$, thereby effectively suppressing spurious responses caused by the SH waves.

Although $LiNbO_3$ substrates with Euler angles (0°, θ, 0°) were used in the experiments in the preferred embodiments described above, φ and ψ of the Euler angles are not necessarily restricted to 0°. Results similar to the experimental results are obtained when φ and ψ are in the range of about 0°±5°. In summary, $LiNbO_3$ substrates in preferred embodiments of the present invention preferably have Euler angles in the range of (0°±5°, 180° to 247°, 0°±5°).

Although the IDT electrode 3 was made of Al, Au, Cu, or Ta in the preferred embodiments described above, preferred embodiments of the present invention are not limited thereto as long as a metal primarily including Al, Au, Cu, or Ta is used. The IDT electrode 3 may preferably be made of an alloy primarily including Al, Au, Cu, or Ta, for example. The metal primarily including Al may preferably be a multilayer metal film including a metal film primarily including Al, Au, Cu, or Ta and a metal film made of a metal or an alloy having a higher density than Al. Examples of such a metal or an alloy having

TABLE 15

| Film thickness of IDT electrode (mainly containing Ta) | Cut angle achieving $K_R^2 > 0.08$ | Cut angle achieving $K_R^2 > 0.08$ | Cut angle achieving $K_{SH}^2 < 0.02$ | $K_R^2 > 0.08$ and $K_{SH}^2 < 0.02$ |
|---|---|---|---|---|
| 1.5% < h/λ ≤ 2.5% | 17.5% < h/λ ≤ 22.5% | 208~228 | 206~224 | 208~224 |
|  | 22.5% < h/λ ≤ 27.5% | 208~228 | 206~225 | 208~225 |
|  | 27.5% < h/λ ≤ 32.5% | 208~228 | 205~226 | 208~226 |
|  | 32.5% < h/λ ≤ 37.5% | 210~224 | 202~228 | 210~224 |
| 2.5% < h/λ ≤ 3.5% | 17.5% < h/λ ≤ 22.5% | 206~230 | 206~224 | 206~224 |
|  | 22.5% < h/λ ≤ 27.5% | 206~230 | 206~224 | 206~224 |
|  | 27.5% < h/λ ≤ 32.5% | 207~229 | 206~225 | 207~225 |
|  | 32.5% < h/λ ≤ 37.5% | 208~228 | 204~226 | 208~226 |
| 3.5% < h/λ ≤ 4.5% | 17.5% < h/λ ≤ 22.5% | 204~230 | 207~224 | 207~224 |
|  | 22.5% < h/λ ≤ 27.5% | 206~230 | 207~224 | 207~224 |
|  | 27.5% < h/λ ≤ 32.5% | 207~229 | 209~224 | 209~224 |
|  | 32.5% < h/λ ≤ 37.5% | 207~229 | 205~226 | 207~226 |
| 4.5% < h/λ ≤ 5.5% | 17.5% < h/λ ≤ 22.5% | 204~232 | 207~223 | 207~223 |
|  | 22.5% < h/λ ≤ 27.5% | 205~230 | 207~223 | 207~223 |
|  | 27.5% < h/λ ≤ 32.5% | 206~230 | 207~224 | 207~224 |
|  | 32.5% < h/λ ≤ 37.5% | 206~230 | 207~225 | 207~225 |

Referring to Table 16 below, SH waves, which cause spurious responses, more preferably have an electromechanical coefficient $K_{SH}^2$ of less than about 0.01 by selecting the Euler angle θ in the range of about 208° to about 224° and by selecting the Euler angle θ, the normalized film thickness (%) of the $SiO_2$, and the normalized film thickness (%) of the IDT electrode from the ranges shown in Table 16.

TABLE 16

| Film thickness of IDT electrode (mainly containing Ta) | Thickness of $SiO_2$ film | Cut angle achieving $K_R^2 > 0.08$ | Cut angle achieving $K_{SH}^2 < 0.01$ | $K_R^2 > 0.08$ and $K_{SH}^2 < 0.01$ |
|---|---|---|---|---|
| 1.5% < h/λ ≤ 2.5% | 17.5% < h/λ ≤ 22.5% | 208~228 | 209~222 | 209~222 |
|  | 22.5% < h/λ ≤ 27.5% | 208~228 | 209~222 | 209~222 |
|  | 27.5% < h/λ ≤ 32.5% | 208~228 | 208~222 | 208~222 |
|  | 32.5% < h/λ ≤ 37.5% | 210~224 | 204~224 | 210~224 |
| 2.5% < h/λ ≤ 3.5% | 17.5% < h/λ ≤ 22.5% | 206~230 | 210~221 | 210~221 |
|  | 22.5% < h/λ ≤ 27.5% | 206~230 | 210~221 | 210~221 |
|  | 27.5% < h/λ ≤ 32.5% | 207~229 | 209~222 | 209~222 |
|  | 32.5% < h/λ ≤ 37.5% | 208~228 | 208~223 | 208~223 |
| 3.5% < h/λ ≤ 4.5% | 17.5% < h/λ ≤ 22.5% | 204~230 | 210~221 | 210~221 |
|  | 22.5% < h/λ ≤ 27.5% | 206~230 | 210~221 | 210~221 |
|  | 27.5% < h/λ ≤ 32.5% | 207~229 | 210~222 | 210~222 |
|  | 32.5% < h/λ ≤ 37.5% | 207~229 | 208~222 | 208~222 |
| 4.5% < h/λ ≤ 5.5% | 17.5% < h/λ ≤ 22.5% | 204~232 | 210~221 | 210~221 |
|  | 22.5% < h/λ ≤ 27.5% | 205~230 | 211~221 | 211~221 |
|  | 27.5% < h/λ ≤ 32.5% | 206~230 | 211~221 | 211~221 |
|  | 32.5% < h/λ ≤ 37.5% | 206~230 | 210~222 | 210~222 | a higher density than Al may include Ti, Ni, Cr, NiCr, and AlCu. Alternatively, another multilayer metal film may be used that includes a metal film primarily including Al, Au, Ta, or Cu and Al or an alloy primarily including Al disposed on the metal film.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A surface acoustic wave device comprising:
   a piezoelectric substrate having a plurality of grooves provided in an upper surface of the piezoelectric substrate;
   an IDT electrode defined by the grooves filled with a metal; and
   a $SiO_2$ layer arranged to cover the piezoelectric substrate and the IDT electrode and having a substantially flat upper surface; wherein
   the surface acoustic wave device uses a response of a Rayleigh wave excited in the piezoelectric substrate, and the piezoelectric substrate is a $LiNbO_3$ substrate with Euler angles (0°±5°, 180° to 247°, 0°±5°).

2. The surface acoustic wave device according to claim 1, wherein the metal primarily includes one metal selected from the group consisting of Al, Au, Ta, and Cu.

3. The surface acoustic wave device according to claim 2, wherein the metal primarily including the one metal selected from the group consisting of Al, Au, Ta, and Cu is a multilayer metal film including one metal selected from the group consisting of Al, Au, Ta, and Cu or an alloy primarily including the one metal, and an alloy primarily including one metal selected from the group consisting of Ti, Ni, Cr, NiCr, Al, and AlCu disposed thereon.

4. The surface acoustic wave device according to claim 1, wherein the metal primarily includes one metal selected from the group consisting of Al, Au, Ta, and Cu, or an alloy primarily including the one metal.

5. The surface acoustic wave device according to claim 1, wherein
   the metal primarily includes Al; and
   a normalized film thickness (%) of the IDT electrode normalized with a wavelength λ of a surface acoustic wave, a normalized film thickness (%) of the $SiO_2$ film normalized with the wavelength λ of the surface acoustic wave, and θ (°) of Euler angles (φ, θ, ψ) of $LiNbO_3$ are within ranges shown in the table below:

| IDT electrode (mainly containing Al) | Thickness of $SiO_2$ film | θ (°) achieving $K_R^2 > 0.08$ and $K_{SH}^2 < 0.02$ |
|---|---|---|
| 2% < h/λ ≤ 6% | 17.5% < h/λ ≤ 22.5% | 210~228 |
| | 22.5% < h/λ ≤ 27.5% | 201~235 |
| | 27.5% < h/λ ≤ 32.5% | 207~229 |
| | 32.5% < h/λ ≤ 37.5% | 210~225 |
| 6% < h/λ ≤ 10% | 17.5% < h/λ ≤ 22.5% | 205~231 |
| | 22.5% < h/λ ≤ 27.5% | 204~232 |
| | 27.5% < h/λ ≤ 32.5% | 202~231 |
| | 32.5% < h/λ ≤ 37.5% | 202~232 |
| 10% < h/λ ≤ 14% | 17.5% < h/λ ≤ 22.5% | 197~239 |
| | 22.5% < h/λ ≤ 27.5% | 198~238 |
| | 27.5% < h/λ ≤ 32.5% | 194~236 |
| | 32.5% < h/λ ≤ 37.5% | 197~233 |
| 14% < h/λ ≤ 18% | 17.5% < h/λ ≤ 22.5% | 187~243 |
| | 22.5% < h/λ ≤ 27.5% | 181~242 |
| | 27.5% < h/λ ≤ 32.5% | 181~247 |
| | 32.5% < h/λ ≤ 37.5% | 188~236 |
| 18% < h/λ ≤ 22% | 17.5% < h/λ ≤ 22.5% | 180~242 |
| | 22.5% < h/λ ≤ 27.5% | 182~246 |
| | 27.5% < h/λ ≤ 32.5% | 184~238 |
| | 32.5% < h/λ ≤ 37.5% | 208~212 |
| 22% < h/λ ≤ 26% | 17.5% < h/λ ≤ 22.5% | 180~243 |
| | 22.5% < h/λ ≤ 27.5% | 181~240 |
| | 27.5% < h/λ ≤ 32.5% | 191~227 |
| | 32.5% < h/λ ≤ 37.5% | No range achieving $K_R^2 > 0.08$. |

6. The surface acoustic wave device according to claim 1, wherein
   the metal primarily includes Al; and
   a normalized film thickness (%) of the IDT electrode normalized with a wavelength λ of a surface acoustic wave, a normalized film thickness (%) of the $SiO_2$ film normalized with the wavelength λ of the surface acoustic wave, and θ (°) of Euler angles (φ, θ, ψ) of $LiNbO_3$ are within ranges shown in the table below:

| IDT electrode (mainly containing Al) | Thickness of $SiO_2$ film | θ (°) achieving $K_R^2 > 0.08$ and $K_{SH}^2 < 0.01$ |
|---|---|---|
| 2% < h/λ ≤ 6% | 17.5% < h/λ ≤ 22.5% | 210~228 |
| | 22.5% < h/λ ≤ 27.5% | 201~231 |
| | 27.5% < h/λ ≤ 32.5% | 208~225 |
| | 32.5% < h/λ ≤ 37.5% | 210~225 |
| 6% < h/λ ≤ 10% | 17.5% < h/λ ≤ 22.5% | 205~231 |
| | 22.5% < h/λ ≤ 27.5% | 204~232 |
| | 27.5% < h/λ ≤ 32.5% | 206~226 |
| | 32.5% < h/λ ≤ 37.5% | 202~228 |
| 10% < h/λ ≤ 14% | 17.5% < h/λ ≤ 22.5% | 197~238 |
| | 22.5% < h/λ ≤ 27.5% | 198~238 |
| | 27.5% < h/λ ≤ 32.5% | 200~230 |
| | 32.5% < h/λ ≤ 37.5% | 197~233 |
| 14% < h/λ ≤ 18% | 17.5% < h/λ ≤ 22.5% | 187~243 |
| | 22.5% < h/λ ≤ 27.5% | 181~242 |
| | 27.5% < h/λ ≤ 32.5% | 181~247 |
| | 32.5% < h/λ ≤ 37.5% | 188~236 |
| 18% < h/λ ≤ 22% | 17.5% < h/λ ≤ 22.5% | 180~242 |
| | 22.5% < h/λ ≤ 27.5% | 182~246 |
| | 27.5% < h/λ ≤ 32.5% | 184~238 |
| | 32.5% < h/λ ≤ 37.5% | 208~212 |
| 22% < h/λ ≤ 26% | 17.5% < h/λ ≤ 22.5% | 180~243 |
| | 22.5% < h/λ ≤ 27.5% | 181~240 |
| | 27.5% < h/λ ≤ 32.5% | 191~227 |
| | 32.5% < h/λ ≤ 37.5% | No range achieving $K_R^2 > 0.08$. |

7. The surface acoustic wave device according to claim 1, wherein
   the metal primarily includes Au; and
   a normalized film thickness (%) of the IDT electrode normalized with a wavelength λ of a surface acoustic wave, a normalized film thickness (%) of the $SiO_2$ film normalized with the wavelength λ of the surface acoustic wave, and θ (°) of Euler angles (φ, θ, ψ) of $LiNbO_3$ are within ranges shown in the table below:

| Film thickness of IDT electrode (mainly containing Au) | Thickness of SiO$_2$ film | θ (°) out of Euler angles (φ, 0, ψ) achieving $K_R^2 > 0.08$ and $K_{SH}^2 < 0.02$ |
|---|---|---|
| 1.5% < h/λ ≦ 2.5% | 17.5% < h/λ ≦ 22.5% | 208~224 |
| | 22.5% < h/λ ≦ 27.5% | 208~222 |
| | 27.5% < h/λ ≦ 32.5% | 208~224 |
| | 32.5% < h/λ ≦ 37.5% | 210~225 |
| | 37.5% < h/λ ≦ 42.5% | No range achieving $K_R^2 > 0.08$ |
| 2.5% < h/λ ≦ 3.25% | 17.5% < h/λ ≦ 22.5% | 209~221 |
| | 22.5% < h/λ ≦ 27.5% | 209~221 |
| | 27.5% < h/λ ≦ 32.5% | 209~223 |
| | 32.5% < h/λ ≦ 37.5% | 210~225 |
| | 37.5% < h/λ ≦ 42.5% | 212~224 |
| 3.25% < h/λ ≦ 3.75% | 17.5% < h/λ ≦ 22.5% | No range achieving $K_{SH}^2 < 0.020$ |
| | 22.5% < h/λ ≦ 27.5% | No range achieving $K_{SH}^2 < 0.020$ |
| | 27.5% < h/λ ≦ 32.5% | No range achieving $K_{SH}^2 < 0.020$ |
| | 32.5% < h/λ ≦ 37.5% | 210~225 |
| | 37.5% < h/λ ≦ 42.5% | 212~224. |

8. The surface acoustic wave device according to claim 1, wherein
the metal primarily includes Au; and
a normalized film thickness (%) of the IDT electrode normalized with a wavelength λ of a surface acoustic wave, a normalized film thickness (%) of the SiO$_2$ film normalized with the wavelength λ of the surface acoustic wave, and θ (°) of Euler angles (φ, θ, ψ) of LiNbO$_3$ are within ranges shown in the table below:

| Film thickness of IDT electrode (mainly containing Au) | Thickness of SiO$_2$ film | θ (°) out of Euler angles (φ, 0, ψ) achieving $K_R^2 > 0.08$ and $K_{SH}^2 < 0.01$ |
|---|---|---|
| 1.5% < h/λ ≦ 2.5% | 17.5% < h/λ ≦ 22.5% | 210~224 |
| | 22.5% < h/λ ≦ 27.5% | 211~222 |
| | 27.5% < h/λ ≦ 32.5% | 210~224 |
| | 32.5% < h/λ ≦ 37.5% | 210~225 |
| | 37.5% < h/λ ≦ 42.5% | No range achieving $K_R^2 > 0.08$ |
| 2.5% < h/λ ≦ 3.25% | 17.5% < h/λ ≦ 22.5% | 214~221 |
| | 22.5% < h/λ ≦ 27.5% | No range achieving $K_{SH}^2 < 0.01$ |
| | 27.5% < h/λ ≦ 32.5% | 214~218 |
| | 32.5% < h/λ ≦ 37.5% | 210~225 |
| | 37.5% < h/λ ≦ 42.5% | 212~223 |
| 3.25% < h/λ ≦ 3.75% | 17.5% < h/λ ≦ 22.5% | No range achieving $K_{SH}^2 < 0.01$ |
| | 22.5% < h/λ ≦ 27.5% | No range achieving $K_{SH}^2 < 0.01$ |
| | 27.5% < h/λ ≦ 32.5% | No range achieving $K_{SH}^2 < 0.01$ |
| | 32.5% < h/λ ≦ 37.5% | No range achieving $K_{SH}^2 < 0.01$ |
| | 37.5% < h/λ ≦ 42.5% | 212~222. |

9. The surface acoustic wave device according to claim 1, wherein
the metal primarily includes Cu; and
a normalized film thickness (%) of the IDT electrode normalized with a wavelength λ of a surface acoustic wave, a normalized film thickness (%) of the SiO$_2$ film normalized with the wavelength λ of the surface acoustic wave, and θ (°) of Euler angles (φ, θ, ψ) of LiNbO$_3$ are within ranges shown in the table below:

| Film thickness of IDT electrode (mainly containing Cu) | Thickness of SiO$_2$ film | θ (°) out of Euler angles (φ, 0, ψ) achieving $K_R^2 > 0.08$ and $K_{SH}^2 < 0.02$ |
|---|---|---|
| 1% < h/λ ≦ 3% | 17.5% < h/λ ≦ 22.5% | 209~225 |
| | 22.5% < h/λ ≦ 27.5% | 209~225 |
| | 27.5% < h/λ ≦ 32.5% | 209~226 |
| | 32.5% < h/λ ≦ 37.5% | 214~222 |
| | 37.5% < h/λ ≦ 42.5% | No range achieving $K_R^2 > 0.08$ |
| 3% < h/λ ≦ 5% | 17.5% < h/λ ≦ 22.5% | 207~224 |
| | 22.5% < h/λ ≦ 27.5% | 207~225 |
| | 27.5% < h/λ ≦ 32.5% | 206~226 |
| | 32.5% < h/λ ≦ 37.5% | 207~227 |
| | 37.5% < h/λ ≦ 42.5% | No range achieving $K_R^2 > 0.08$ |
| 5% < h/λ ≦ 7% | 17.5% < h/λ ≦ 22.5% | 207~224 |
| | 22.5% < h/λ ≦ 27.5% | 208~225 |
| | 27.5% < h/λ ≦ 32.5% | 206~226 |
| | 32.5% < h/λ ≦ 37.5% | 204~227 |
| | 37.5% < h/λ ≦ 42.5% | 204~228 |
| 7% < h/λ ≦ 9% | 17.5% < h/λ ≦ 22.5% | 208~224 |
| | 22.5% < h/λ ≦ 27.5% | 208~224 |
| | 27.5% < h/λ ≦ 32.5% | 207~225 |
| | 32.5% < h/λ ≦ 37.5% | 205~226 |
| | 37.5% < h/λ ≦ 42.5% | 204~228. |

10. The surface acoustic wave device according to claim 1, wherein
the metal primarily includes Cu; and
a normalized film thickness (%) of the IDT electrode normalized with a wavelength λ of a surface acoustic wave, a normalized film thickness (%) of the SiO$_2$ film normalized with the wavelength λ of the surface acoustic wave, and θ (°) of Euler angles (φ, θ, ψ) of LiNbO$_3$ are within ranges shown in the table below:

| Film thickness of IDT electrode (mainly containing Cu) | Thickness of SiO$_2$ film | θ (°) out of Euler angles (φ, 0, ψ) achieving $K_R^2 > 0.08$ and $K_{SH}^2 < 0.01$ |
|---|---|---|
| 1% < h/λ ≦ 3% | 17.5% < h/λ ≦ 22.5% | 210~222 |
| | 22.5% < h/λ ≦ 27.5% | 210~222 |
| | 27.5% < h/λ ≦ 32.5% | 209~222 |
| | 32.5% < h/λ ≦ 37.5% | 214~222 |
| | 37.5% < h/λ ≦ 42.5% | No range achieving $K_R^2 > 0.08$ |
| 3% < h/λ ≦ 5% | 17.5% < h/λ ≦ 22.5% | 210~222 |
| | 22.5% < h/λ ≦ 27.5% | 210~222 |
| | 27.5% < h/λ ≦ 32.5% | 207~226 |
| | 32.5% < h/λ ≦ 37.5% | 207~224 |
| | 37.5% < h/λ ≦ 42.5% | No range achieving $K_R^2 > 0.08$ |
| 5% < h/λ ≦ 7% | 17.5% < h/λ ≦ 22.5% | 210~222 |
| | 22.5% < h/λ ≦ 27.5% | 210~222 |
| | 27.5% < h/λ ≦ 32.5% | 207~222 |
| | 32.5% < h/λ ≦ 37.5% | 208~224 |
| | 37.5% < h/λ ≦ 42.5% | 204~225 |
| 7% < h/λ ≦ 9% | 17.5% < h/λ ≦ 22.5% | 210~221 |
| | 22.5% < h/λ ≦ 27.5% | 210~221 |
| | 27.5% < h/λ ≦ 32.5% | 210~222 |
| | 32.5% < h/λ ≦ 37.5% | 208~223 |
| | 37.5% < h/λ ≦ 42.5% | 206~224. |

11. The surface acoustic wave device according to claim 1, wherein
the metal primarily includes Ta; and
a normalized film thickness (%) of the IDT electrode normalized with a wavelength λ of a surface acoustic wave, a normalized film thickness (%) of the SiO$_2$ film normalized with the wavelength λ of the surface acoustic wave, and θ (°) of Euler angles (φ, θ, ψ) of LiNbO$_3$ are within ranges shown in the table below:

| Film thickness of IDT electrode (mainly containing Ta) | Thickness of SiO$_2$ film | θ (°) out of Euler angles (φ, θ, ψ) achieving $K_R^2 > 0.08$ and $K_{SH}^2 < 0.02$ |
| --- | --- | --- |
| 1.5% < h/λ ≦ 2.5% | 17.5% < h/λ ≦ 22.5% | 208~224 |
|  | 22.5% < h/λ ≦ 27.5% | 208~225 |
|  | 27.5% < h/λ ≦ 32.5% | 208~226 |
|  | 32.5% < h/λ ≦ 37.5% | 210~224 |
| 2.5% < h/λ ≦ 3.5% | 17.5% < h/λ ≦ 22.5% | 206~224 |
|  | 22.5% < h/λ ≦ 27.5% | 206~224 |
|  | 27.5% < h/λ ≦ 32.5% | 207~225 |
|  | 32.5% < h/λ ≦ 37.5% | 208~226 |
| 3.5% < h/λ ≦ 4.5% | 17.5% < h/λ ≦ 22.5% | 207~224 |
|  | 22.5% < h/λ ≦ 27.5% | 207~224 |
|  | 27.5% < h/λ ≦ 32.5% | 209~224 |
|  | 32.5% < h/λ ≦ 37.5% | 207~226 |
| 4.5% < h/λ ≦ 5.5% | 17.5% < h/λ ≦ 22.5% | 207~223 |
|  | 22.5% < h/λ ≦ 27.5% | 207~223 |
|  | 27.5% < h/λ ≦ 32.5% | 207~224 |
|  | 32.5% < h/λ ≦ 37.5% | 207~225. |

12. The surface acoustic wave device according to claim 1, wherein the metal primarily includes Ta; and a normalized film thickness (%) of the IDT electrode normalized with a wavelength λ of a surface acoustic wave, a normalized film thickness (%) of the SiO$_2$ film normalized with the wavelength λ of the surface acoustic wave, and θ (°) of Euler angles (φ, θ, ψ) of LiNbO$_3$ are within ranges shown in the table below:

| Film thickness of IDT electrode (mainly containing Ta) | Thickness of SiO$_2$ film | θ (°) out of Euler angles (φ, θ, ψ) achieving $K_R^2 > 0.08$ and $K_{SH}^2 < 0.01$ |
| --- | --- | --- |
| 1.5% < h/λ ≦ 2.5% | 17.5% < h/λ ≦ 22.5% | 209~222 |
|  | 22.5% < h/λ ≦ 27.5% | 209~222 |
|  | 27.5% < h/λ ≦ 32.5% | 208~222 |
|  | 32.5% < h/λ ≦ 37.5% | 210~224 |
| 2.5% < h/λ ≦ 3.5% | 17.5% < h/λ ≦ 22.5% | 210~221 |
|  | 22.5% < h/λ ≦ 27.5% | 210~221 |
|  | 27.5% < h/λ ≦ 32.5% | 209~222 |
|  | 32.5% < h/λ ≦ 37.5% | 208~223 |
| 3.5% < h/λ ≦ 4.5% | 17.5% < h/λ ≦ 22.5% | 210~221 |
|  | 22.5% < h/λ ≦ 27.5% | 210~221 |
|  | 27.5% < h/λ ≦ 32.5% | 210~222 |
|  | 32.5% < h/λ ≦ 37.5% | 208~222 |
| 4.5% < h/λ ≦ 5.5% | 17.5% < h/λ ≦ 22.5% | 210~221 |
|  | 22.5% < h/λ ≦ 27.5% | 211~221 |
|  | 27.5% < h/λ ≦ 32.5% | 211~221 |
|  | 32.5% < h/λ ≦ 37.5% | 210~222. |

\* \* \* \* \*